United States Patent
Weis et al.

(10) Patent No.: US 8,970,262 B2
(45) Date of Patent: Mar. 3, 2015

(54) SEMICONDUCTOR DEVICE ARRANGEMENT WITH A FIRST SEMICONDUCTOR DEVICE AND WITH A PLURALITY OF SECOND SEMICONDUCTOR DEVICES

(75) Inventors: Rolf Weis, Villach (AT); Franz Hirler, Isen (DE); Martin Feldtkeller, Munich (DE); Gerald Deboy, Klagenfurt (AT); Matthias Stecher, Munich (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/978,373
(22) PCT Filed: Jan. 9, 2012
(86) PCT No.: PCT/EP2012/050245
§ 371 (c)(1),
(2), (4) Date: Nov. 20, 2013
(87) PCT Pub. No.: WO2012/093177
PCT Pub. Date: Jul. 12, 2012

(65) Prior Publication Data
US 2014/0062544 A1 Mar. 6, 2014

Related U.S. Application Data

(63) Continuation of application No. 13/275,151, filed on Oct. 17, 2011, now Pat. No. 8,569,842, which is a continuation-in-part of application No. 12/986,784, filed on Jan. 7, 2011, now Pat. No. 8,455,948.

(51) Int. Cl.
*H03B 1/00* (2006.01)
*H03K 3/00* (2006.01)
(Continued)

(52) U.S. Cl.
CPC ............. *H01L 27/088* (2013.01); *H03K 17/06* (2013.01); *H01L 21/823418* (2013.01);
(Continued)

(58) Field of Classification Search
USPC .................................................. 327/108–112
See application file for complete search history.

(56) References Cited

U.S. PATENT DOCUMENTS

| | | | |
|---|---|---|---|
| 4,317,055 A | 2/1982 | Yoshida et al. |
| 4,367,421 A | 1/1983 | Baker |

(Continued)

FOREIGN PATENT DOCUMENTS

| | | | |
|---|---|---|---|
| DE | 3100795 A1 | 8/1982 |
| DE | 3335475 A1 | 5/1985 |

(Continued)

OTHER PUBLICATIONS

Biela, J., et al., "5kV/200ns Pulsed Power Switch based on a SiC-JFET Super Cascode," IEEE, May 27-31, 2008, pp. 358-361.

*Primary Examiner* — Adam Houston
(74) *Attorney, Agent, or Firm* — Slater and Matsil, L.L.P.

(57) ABSTRACT

Disclosed is a semiconductor device arrangement including a first semiconductor device having a load path, and a plurality of second transistors, each having a load path between a first and a second load terminal and a control terminal. The second transistors have their load paths connected in series and connected in series to the load path of the first transistor, each of the second transistors has its control terminal connected to the load terminal of one of the other second transistors, and one of the second transistors has its control terminal connected to one of the load terminals of the first semiconductor device.

25 Claims, 15 Drawing Sheets

(51) Int. Cl.
   *H01L 27/088* (2006.01)
   *H03K 17/06* (2006.01)
   *H01L 21/8234* (2006.01)
   *H01L 29/78* (2006.01)
   *H01L 29/423* (2006.01)
   *H01L 27/098* (2006.01)
   *H01L 29/06* (2006.01)

(52) U.S. Cl.
   CPC ........... *H01L 29/78* (2013.01); *H01L 29/7817* (2013.01); *H01L 29/7824* (2013.01); *H01L 29/7825* (2013.01); *H01L 29/7835* (2013.01); *H01L 29/7838* (2013.01); *H01L 27/0883* (2013.01); *H01L 21/823437* (2013.01); *H01L 29/4236* (2013.01); *H01L 29/4238* (2013.01); *H01L 27/098* (2013.01); *H01L 29/0692* (2013.01); *H01L 29/0696* (2013.01); *H01L 21/823431* (2013.01)
   USPC ........... 327/109; 327/108; 327/110; 327/111; 327/112

(56) References Cited

U.S. PATENT DOCUMENTS

| | | |
|---|---|---|
| 4,468,686 A | 8/1984 | Rosenthal |
| 4,487,458 A | 12/1984 | Janutka |
| 4,751,408 A | 6/1988 | Rambert |
| 4,893,070 A | 1/1990 | Milberger et al. |
| 5,237,193 A | 8/1993 | Williams et al. |
| 5,285,369 A | 2/1994 | Balakrishnan |
| 5,557,127 A | 9/1996 | Ajit et al. |
| 5,696,659 A | 12/1997 | Maruo |
| 6,304,094 B2 | 10/2001 | Gilliam |
| 6,365,930 B1 * | 4/2002 | Schillaci et al. ............... 257/339 |
| 6,504,697 B1 | 1/2003 | Hille |
| 6,888,396 B2 * | 5/2005 | Hajimiri et al. ............... 327/427 |
| 6,914,297 B2 | 7/2005 | Deboy et al. |
| 8,455,948 B2 * | 6/2013 | Weis ............... 257/339 |
| 8,759,939 B2 * | 6/2014 | Weis ............... 257/499 |
| 2003/0071320 A1 | 4/2003 | Kocon |
| 2004/0089896 A1 | 5/2004 | Sakakibara |
| 2006/0028901 A1 | 2/2006 | Bromberger et al. |
| 2006/0098365 A1 | 5/2006 | Harris et al. |
| 2010/0032671 A1 | 2/2010 | Marshall |
| 2010/0078694 A1 | 4/2010 | Willmeroth et al. |
| 2010/0078707 A1 | 4/2010 | Haeberlen et al. |
| 2010/0102871 A1 * | 4/2010 | Werner ............... 327/534 |
| 2010/0301403 A1 | 12/2010 | Min et al. |
| 2012/0175634 A1 * | 7/2012 | Weis ............... 257/77 |
| 2012/0175635 A1 * | 7/2012 | Weis et al. ............... 257/77 |
| 2013/0020635 A1 * | 1/2013 | Yilmaz et al. ............... 257/334 |
| 2013/0193512 A1 * | 8/2013 | Weis ............... 257/337 |
| 2013/0193525 A1 * | 8/2013 | Weis et al. ............... 257/379 |
| 2013/0264654 A1 * | 10/2013 | Weis et al. ............... 257/392 |
| 2014/0016361 A1 * | 1/2014 | Weis et al. ............... 363/21.02 |
| 2014/0062544 A1 * | 3/2014 | Weis et al. ............... 327/109 |
| 2014/0062585 A1 * | 3/2014 | Weis ............... 327/541 |

FOREIGN PATENT DOCUMENTS

| | | |
|---|---|---|
| DE | 19745040 A1 | 8/1998 |
| DE | 10234493 B3 | 2/2004 |
| DE | 102004041198 A1 | 3/2006 |
| DE | 102007013848 A1 | 9/2008 |
| EP | 0140349 | 5/1985 |
| EP | 1058318 A1 | 12/2000 |
| EP | 2521259 A2 | 11/2012 |
| GB | 2318685 A | 4/1998 |
| JP | 2007-242719 A | 9/2007 |
| WO | 9501667 A1 | 1/1995 |
| WO | 2004107448 A1 | 12/2004 |
| WO | 2012093177 A2 | 7/2012 |

* cited by examiner

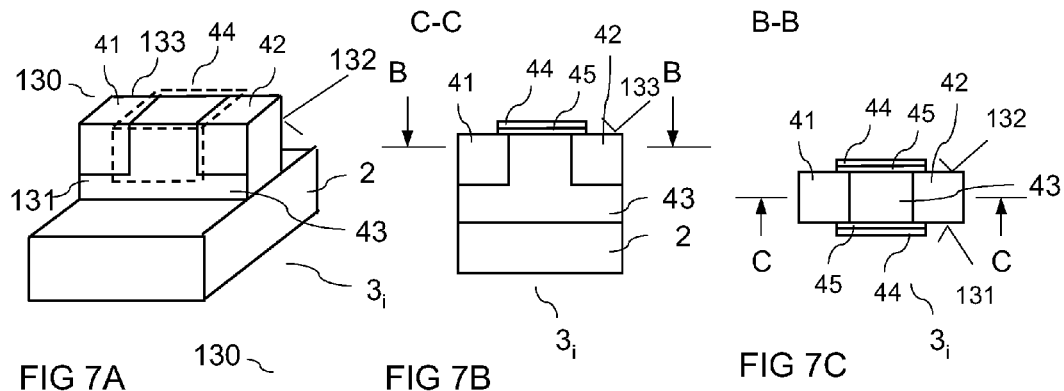
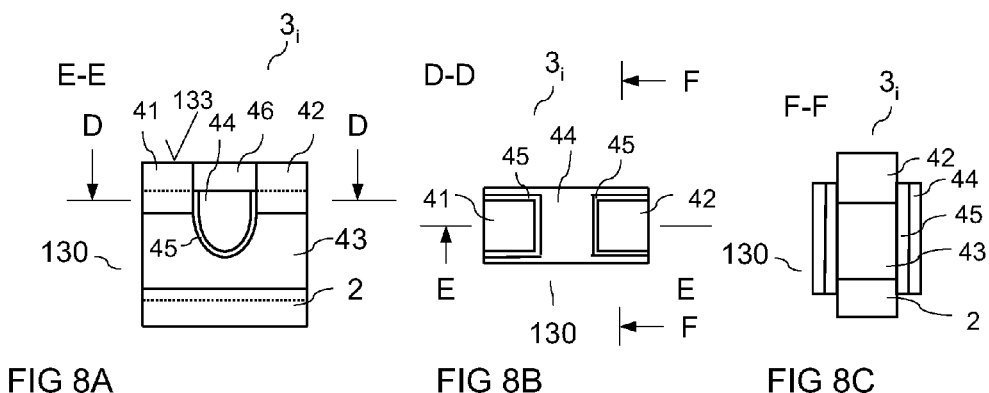
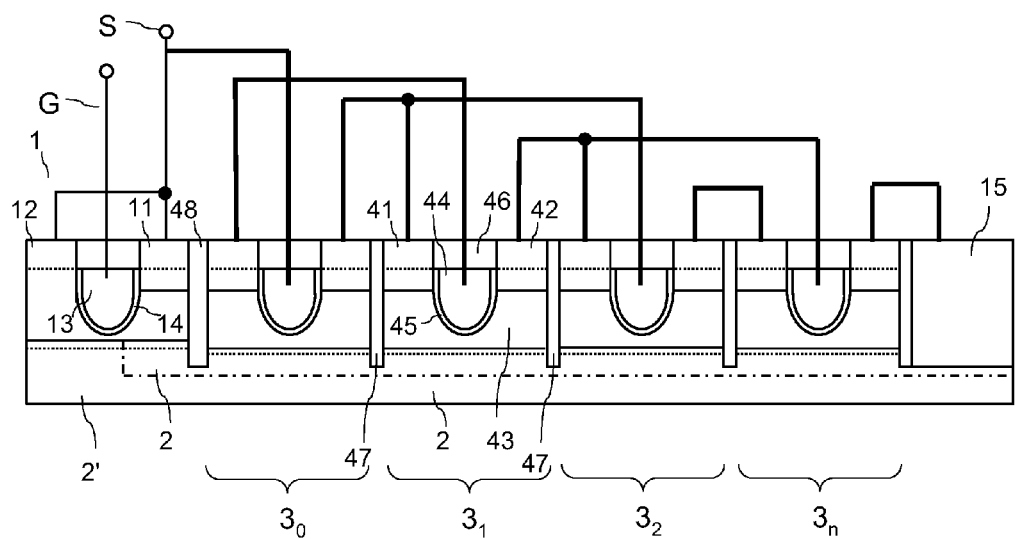

SEMICONDUCTOR DEVICE ARRANGEMENT WITH A FIRST SEMICONDUCTOR DEVICE AND WITH A PLURALITY OF SECOND SEMICONDUCTOR DEVICES

TECHNICAL FIELD

Embodiments of the present invention relate to a semiconductor device arrangement with a first semiconductor device, such as a transistor or a diode, and with a plurality of second semiconductor devices, such transistors, in particular low-voltage transistors.

BACKGROUND

One important aim in the development of power semiconductor devices, such as power transistors or power diodes, is to produce devices with a high voltage blocking capability but, nevertheless, a low on-resistance ($R_{ON}$) and which have low switching losses.

Power transistors usually include a drift region arranged between a body region and a drain region and doped lower than the drain region. The on-resistance of a conventional power transistor is dependent on the length of the drift region in a current flow direction and on the doping concentration of the drift region, wherein the on-resistance decreases when the length of the drift region is reduced or when the doping concentration in the drift region is increased. However, reducing the length of the region or increasing the doping concentration reduces the voltage blocking capability.

One possible way to reduce the on-resistance of a power transistor for a given voltage blocking capability is to provide compensation regions in the drift region, wherein the compensation regions are doped complementary to the drift region. Another possible way is to provide field plates in the drift region which are dielectrically insulated from the drift region and which are, for example, connected to a gate or source terminal of the transistor. In these types of power transistors, the compensation zones or the field plates partly "compensate" doping charges in the drift region when the component is in its off-state. This allows to provide a higher doping of the drift region—which reduces the on-resistance—without reducing the voltage blocking capability.

A power diode (pin diode) usually includes a low doped drift or base region between a first emitter region of a first doping type and a second emitter region of a second doping type. A power diode is configured to block when a voltage with a first polarity (blocking voltage) is applied between the first and second emitter regions, and is configured to conduct a current when a voltage with a second polarity is applied between the first and second emitter regions. In the conducting state, however, a charge carrier plasma with charge carriers of the first and second type (p-type and n-type charge carriers) is generated in the base region. The amount of charge carrier plasma stored in the base region is dependent on a length of the base region and is, therefore, dependent on the voltage blocking capability, where the amount of charge carrier plasma increases when the voltage blocking capability increases. This charge carrier plasma has to be removed before the diode may block upon applying a blocking voltage.

These known devices, however, have a high output capacitance. There is, therefore a need to provide a power semiconductor device with a high voltage blocking capability, a low on-resistance and a low output capacitance.

SUMMARY

A first embodiment relates to a semiconductor device arrangement including a first semiconductor device having a load path, and a plurality of second transistors, each having a load path between a first and a second load terminal and a control terminal. The second transistors have their load paths connected in series and connected in series to the load path of the first transistor. Each of the second transistors has its control terminal connected to the load terminal of one of the other second transistors, and one of the second transistors has its control terminal connected to one of the load terminals of the first semiconductor device.

A second embodiment relates to a transistor arrangement. The transistor arrangement includes a first transistor with a drift region, a plurality of second transistors each having a source region, a drain region and a gate electrode. The second transistors are connected in series to form a series circuit which is connected in parallel with the drift region of the first transistor. The source regions of the second transistors are coupled to the drift region and the gate electrodes of the second transistors are coupled to the drift region such that the source region and the gate region of each of the second transistors are coupled to the drift region at different positions.

A third embodiment relates to a circuit arrangement including a transistor arrangement with a first transistor having a load path and a control terminal and with a plurality of second transistors, each having a load path between a first and a second load terminal and a control terminal. The second transistors have their load paths connected in series and connected in series to the load path of the first transistor, and each of the second transistors has its control terminal connected to the load terminal of one of the other second transistors, and one of the second transistors has its control terminal connected to one of the load terminals of the first transistor. The circuit arrangement further includes a capacitive storage element connected to the load terminal of one of the second transistors.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 2 which includes

FIG. 6 which includes

FIG. 7 which includes FIGS. 7A to 7C, illustrates a second embodiment for implementing the second transistors.

FIG. 8 which includes FIGS. 8A to 8C, schematically illustrates a further embodiment for implementing the second transistors.

FIG. 9 schematically illustrates a transistor arrangement which includes second transistors according to FIG. 8.

FIG. 14 which includes

FIG. 22 that includes

FIG. 24 that includes

FIG. 27 that includes

DETAILED DESCRIPTION OF THE DRAWINGS

Figure 1:
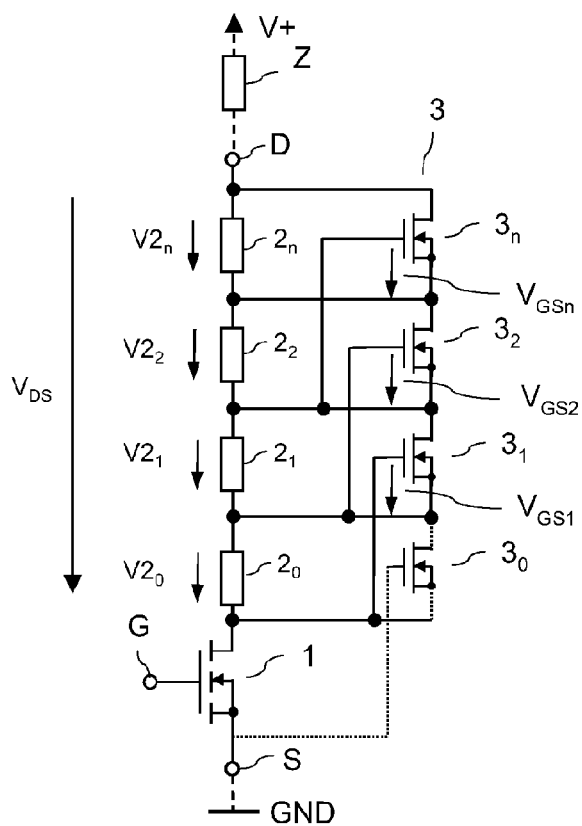
FIG. 1 illustrates a transistor arrangement with a first transistor having a drift region, and with a plurality of second transistors connected in series with each other and having source regions and gate electrodes coupled to the drift region of the first transistor.

FIG. 1 schematically illustrates a first embodiment of a transistor arrangement. The transistor arrangement includes a first transistor 1 implemented as an MOS transistor. The first transistor 1 includes a source terminal S which electrically contacts a source region, a gate terminal G which electrically contacts a gate electrode, and a drain terminal D which electrically contacts a drain region. In FIG. 1, the first transistor 1 is represented by its circuit symbol, so that the source S, gate G, and drain D terminals but not the source region, the gate electrode and the drain region are shown.

The first transistor 1 of FIG. 1 is a power transistor which further includes a drift region. The drift region is arranged between the drain terminal D and the source terminal S, and is a doped semiconductor region which mainly defines the voltage blocking capability of the first transistor 1. A conventional circuit symbol of an MOS transistor does not explicitly show or illustrate the drift region of the MOS transistor. However, since the drift region has a relevant function in the transistor arrangement illustrated in FIG. 1, the drift region of the first transistor 1, additionally to the circuit symbol, is also illustrated in FIG. 1. The drift region is represented by a series circuit with resistors $2_0$, $2_1$, $2_2$, $2_n$ connected between the drain terminal D and a body region (not shown in FIG. 1) of the first transistor 1. Since the drift region is a doped semiconductor region, each of the resistors $2_0$-$2_n$ illustrated in FIG. 1 represents the resistance of one section of the drift region.

Before explaining the other features of the transistor arrangement of FIG. 1, the basic operating principle of the first transistor 1 with the drift zone will be explained. For explanation purposes it will be assumed that the first transistor 1 is an n-type enhancement MOSFET (as represented by the circuit symbol in FIG. 1). However, any other type of MOS transistor, like an n-type depletion transistor, a p-type enhancement transistor, a p-type depletion transistor, or an IGBT, can be used as well. The different types of transistors have the same operating principle, which is that they can be switched on and off by applying a suitable drive potential to the gate terminal G or a suitable drive voltage between the gate terminal G and the source terminal S, respectively. The difference is that the control voltages (gate-source voltages) at which the individual transistors are switched on and off are different for the different types of transistors.

The n-type enhancement MOSFET 1 of FIG. 1 can be switched on by applying a positive voltage between the gate and the source terminals G, S. In the on-state of the first transistor 1 a resistance between the drain terminal D and the source terminal S, which is also referred to as on-resistance, is mainly defined by the drift region, in particular, by the doping concentration of the drift region and the length of the drift region in the current flow direction. A drain-source voltage $V_{DS}$ of the first transistor 1 mainly drops across the drift region when the transistor is in its on-state. This voltage drop is dependent on the on-resistance of the first transistor 1 and on a load current flowing through the transistor. The first transistor 1 can, for example, be used for switching a load current through a load Z. For this, the first transistor 1 can be connected in series with a load Z between terminals for a positive supply potential V+ and a negative supply potential or reference potential GND. When the first transistor 1 is switched on, the supply voltage which is present between the supply terminals mainly drops across the load Z, wherein the voltage drop across the first transistor 1 is defined by the load current and the on-resistance of the first transistor 1. In conventional power transistors this voltage drop is, for example, typically in the range of between 0.1V and 3V.

When the first transistor 1 is switched off, the voltage drop across the first transistor 1 increases. In the off-state of the first transistor 1, the voltage $V_{DS}$ which is applied between the drain and source terminals D, S mainly drops across the drift region which, besides the on-resistance, also defines the voltage blocking capability of the first transistor 1. This is because in the off-state, the drift zone is depleted of charge carriers. The voltage blocking capability and, therefore, the voltage drop $V_{DS}$ across the drift region can be in the range of between several 10 volts (V) to several 100 volts (V) up to 1 kV and more. This voltage blocking capability is dependent on the specific implementation of the drift and is in particular dependent on a doping concentration of the drift region and of a length of the drift region in a current flow direction.

In order to reduce the electrical resistance between the drain and the source terminals D, S when the first transistor 1 is switched on, the transistor arrangement of FIG. 1 further includes a plurality of second transistors $3_1$, $3_2$, $3_n$. These second transistors are also implemented as MOS transistors which each include a gate terminal contacting a gate electrode, a drain terminal connecting a drain region and a source terminal connecting a source region. These second transistors $3_1$, $3_2$, $3_n$ are connected in series, with the series circuit with the second transistors $3_1$, $3_2$, $3_n$ being connected in parallel with the drift region. Further, the source terminal or source region of each of the second transistors is coupled to the drift region. Optionally, the gate terminal or gate electrode of each of the second transistors $3_0$, $3_1$, $3_2$, $3_n$ is also coupled to the drift region. In the following, when reference is made to an arbitrary one of the second semiconductor devices (transistors) or to the plurality of the second semiconductor devices, and when no differentiation between individual second semiconductor devices is required, reference number $3_i$ will be used to denote the second semiconductor devices and their individual parts.

In the embodiment illustrated in FIG. 1, each of the second transistors $3_1$, $3_2$, $3_n$ is connected in parallel with one section of the drift region, wherein the individual sections of the drift region are represented by the resistors $2_1$, $2_2$, $2_n$ in FIG. 1. The second transistors $3_1$, $3_2$, $3_n$ are switched on and off dependent on the voltage drop across the drift region, so that no additional external terminals are required for controlling the second transistors, wherein the second transistors may influence or define the voltage across the drift region. The overall transistor arrangement illustrated in FIG. 1 can be switched on and off like a conventional transistor by applying a suitable control voltage between the gate and source terminals G, S of the first transistor 1.

In FIG. 1, the gate electrodes and the source regions of the second transistors $3_1$, $3_2$, $3_n$ are coupled to the drift region such that each of the second transistors $3_1$, $3_2$, $3_n$ is controlled by the voltage drop across one associated section of the drift region. In FIG. 1, a first one $3_1$ of the second transistors is, for example, controlled by a voltage drop $V2_0$ across a first section $2_0$ of the drift region, a second one $3_2$ of the transistors is controlled by a voltage drop $V2_1$ across a second section $2_1$ of the drift region, etc. For this, the first drift region section $2_0$ is connected between gate and source of the second transistor $3_1$, the second drift region section $2_1$ is connected between gate and source of the transistor $3_2$, etc. The control voltage of any of the second transistors is dependent on the voltage drop $V_{DS}$ across the drift region and is dependent on the distance between the positions at which the gate electrode and the source region of the second transistor is coupled to the drift region.

In order to reduce the on-resistance of the first transistor 1 with the drift zone, the second transistors $3_1$, $3_2$, $3_n$ are switched on when the first transistor 1 is in its on-state, as the voltage drop is becoming small across the drift zone. When the first transistor 1 is in its off-state, the second transistors $3_1$, $3_2$, $3_n$ are switched off, because of the high voltage drop $V_{DS}$ over the drift zone with the depleted drift zone charge carrier. When the first transistor 1 is in its on-state, the resistance of its drift region is low, so that a voltage drop $V_{DS}$ across the drift region is low and, consequently, the voltage drops $V2_0$, ..., $V2_n$ across the individual drift region sections $2_0$, ..., $2_n$ are low. When the first transistor 1 is in its off-state, the voltage drop $V_{DS}$ across the drift region is significantly higher than in the on-state and, consequently, the voltage drops $V2_0$, ..., $V2_n$ across the individual drift region sections are also significantly higher than in the on-state.

According to one embodiment, the positions at which the source regions and the gate electrodes of the individual transistors are connected to the drift region are selected such that the absolute value of the drive voltage between the gate electrode and the source region is very small, e.g. between 0.005V and 0.5V when the first transistor 1 is in its on-state, and is e.g. between 1V and 30V when the first transistor 1 is in its off-state.

The drive voltage of the second transistors $3_1$-$3_n$ is low, like in the absolute range of between 0.005V and 0.5V, when the first transistor 1 is on, and the voltage drop over the second transistors $3_1$-$3_n$ is high, like in the absolute range of between 1V and 30V, when the first transistor 1 is off. The individual second transistors $3_1$-$3_n$ are selected such that they can be switched on by the low voltage drop across their associated drift region section when the first transistor is in its on-state, and that they can be switched off by the high voltage drop across their associated drift region section if the first transistor 1 is in its off-state. In FIG. 1, the second transistor are connected such that positive voltage drops across the individual drift region sections result in negative drive voltages of the individual second transistors. For example, $V_{GS1}=-V2_0$, where $V_{GS1}$ is the control voltage (gate-source voltage) of first transistor $3_1$. Equivalently, $V_{GS2}=-V2_1$, where $V_{GS2}$ is the control voltage of the second transistor $3_2$. When the first transistor 1 is an n-type transistor, the second transistors are selected such that they can be switched on by a low negative control voltage and that they can be switched off by a higher negative control voltage. Suitable transistors are, for example, n-type depletion transistors. However, p-type depletion transistors can be used as well. In this case, the second transistors are coupled to the drift region such that a low positive control voltage is applied to the second transistors when the first transistor 1 is in its on-state and that a higher positive control voltage is applied to the second transistors when the first transistor 1 is in its off-state. Even enhancement transistors could be used for the second transistors when the work function of the gate electrode is chosen such that an n-type transistor is already switched on at a low negative drive voltage and that a p-type transistor is switched on at a low positive drive voltage.

In the embodiment illustrated in FIG. 1, a first section $2_0$ of the drift region, which is the section arranged most distant to the drain terminal D and closest to the source terminal S, serves to generate the control voltage for the first one $3_1$ of the second transistors, but has no second transistor connected in parallel. Optionally, a second transistor $3_0$ is also connected in parallel with this first drift region section $2_0$, wherein the gate terminal of this transistor $3_0$ is connected to the source terminal of the first transistor 1.

Figures 2A, 2B:
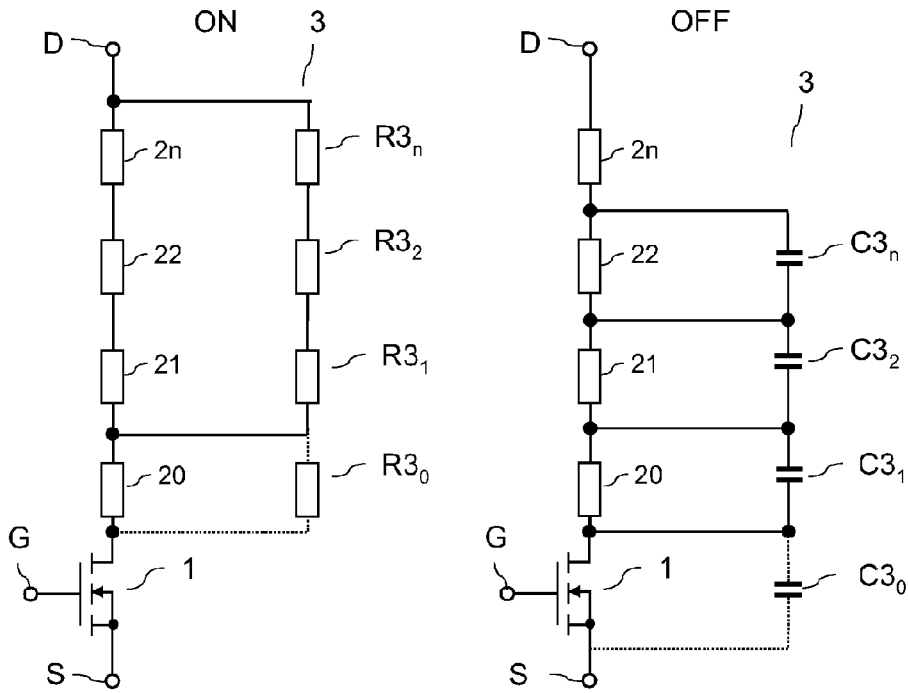
FIGS. 2A and 2B, show the equivalent circuit diagrams of the transistor arrangement of FIG. 1 when the first transistor is switched on (FIG. 2A) and when the first transistor is switched off (FIG. 2B).

FIGS. 2A and 2B show the equivalent circuit diagram of the transistor arrangement of FIG. 1 when the first transistor 1 is in its on-state (see FIG. 2A) and when the first transistor 1 is in its off-state (see FIG. 2B). Referring to FIG. 2A, when the first transistor 1 is in its on-state the second transistors $3_1$-$3_n$ and the optional second transistor $3_0$ are switched on and, therefore, provide a current path parallel to the drift region which helps to reduce the overall on-resistance of the transistor arrangement. This current path parallel to the drift region is represented in FIG. 2A by a series circuit with resistors $R3_1$, $R3_2$, $R3_n$ (and optional $R3_0$) wherein each of these resistors represents the on-resistance of one of the second transistors $3_1$-$3_n$. The second transistors $3_0$, $3_1$-$3_n$ are low voltage transistors which according to one embodiment have an on-resistance which is lower than the resistance of the drift region sections $2_0$, $2_1$-$2_n$.

When the first transistor 1 is switched off and, therefore, the second transistors are also switched off—as the voltage $V_{DS}$ drops over the drift zone—the series circuit with the gate-source capacitances of the second transistors $3_0$, $3_1$-$3_n$ dominate the function of the second transistors $3_0$, $3_1$-$3_n$. The drift zone is depleted of charge carriers and therefore can be left away. In the off-state of the first transistor 1, the gate source capacitance of any one of the second transistors, like, e.g., transistor $3_2$, stores those electrical charges which, in the on-state of the first transistor 1, were required in the neighbouring transistor, like, e.g., transistor $3_1$, for generating a conducting channel in the body region of this neighbouring transistor. Thus, electrical charges which are required for switching on and off the individual second transistors are only shifted between the body region of one second transistor and the gate-source capacitance of a neighbouring second transistor when the first transistor 1 transitions from the on-state to the off-state, and vice versa. Thus, these charges do not have to be provided from externally via the drain and source terminals of the first transistor 1, resulting in a low output capacitance of the transistor arrangement.

In FIG. 2B, the gate-source capacitances $C3_1$-$C3_n$ (and $C3_0$ of the optional transistor $3_0$) are shown. These gate-source capacitances dominate the behaviour of the arrangement when the second transistors are in their off-state.

It should be noted that although in FIG. 1 only n=3 or n+1=4, respectively, second transistors $3_0$, $3_1$, $3_2$, $3_n$ are illustrated, the basic principle is not restricted to this number of second transistors. An arbitrary number of second transistors $3_0$-$3_n$ can be connected in series with each other and in parallel with the drift region, wherein the number of second transistors $3_0$-$3_n$ is dependent on the desired voltage blocking capability of the transistor arrangement with the first transistor 1 and the second transistors $3_0$-$3_n$. Since the second transistors $3_0$-$3_n$ are low-voltage transistors their voltage blocking capability is significantly lower than the voltage blocking capability of the first transistor 1 with the drift zone. If, for example, the voltage blocking capability of the first transistor with the drift zone is $V_{DSmax}$ and the voltage blocking capability of each of the second transistors is $V3_{DSmax}$, then the number of second transistors at least to be connected in series with each other and parallel to the drift region is given by the quotient $V_{DSmax}/V3_{DSmax}$.

Figure 3:
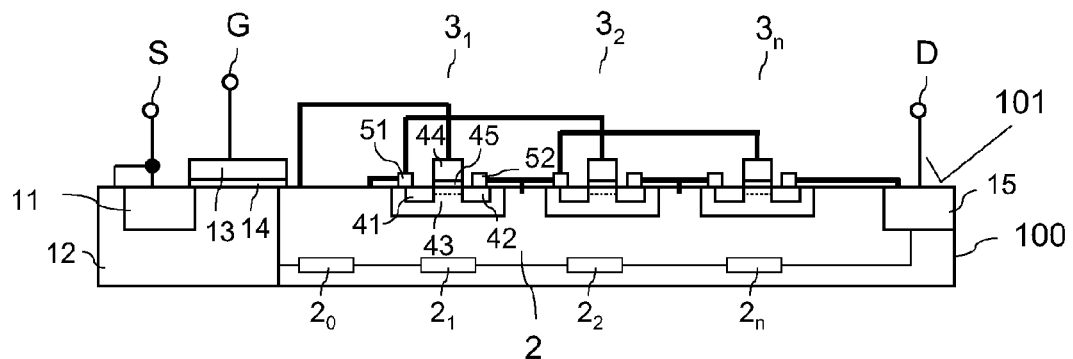
FIG. 3 schematically illustrates a first embodiment for implementing the first and second transistors in a semiconductor body.

FIG. 3 illustrates a first embodiment for implementing the transistor arrangement. In this embodiment, the transistor arrangement includes a semiconductor body 100 in which active semiconductor regions of the first transistor 1 and the second transistors $3_0$-$3_n$ are implemented. Active semiconductor regions of these transistors are source regions, drain regions, body regions and, in case of the first transistor, the drift region. The semiconductor body may include a conventional semiconductor material such as, for example, silicon (Si).

Referring to FIG. 3, the first transistor 1 includes a source region 11 electrically connected to the source terminal S and a drain region 15 electrically connected to the drain terminal D. This transistor is implemented as a lateral transistor, which means that the source region 11 and the drain region 15 are arranged distant to one another in a lateral or horizontal direction of the semiconductor body 100. The first transistor 1 further includes a drift region 2 adjoining the drain region 15, and a body region 12 which is arranged between the source region 11 and the drift region 2. A gate electrode 13 serves to control a conducting channel between the source region 11 and the drift region 2 and is arranged adjacent to the body region 12 and dielectrically insulated from the body region 12 by a gate dielectric 14. The first transistor 1 is in its on-state when an electrical potential is applied to the gate electrode G which is suitable for inducing a conductive channel between the source region 11 and the drift region 2 in the body region 12.

The first transistor 1 is, for example, implemented as an n-type MOSFET. In this case, the source region 11, the drain region 15 and the drift region 2 are n-doped. Further, the first transistor can be implemented as an enhancement transistor or as a depletion transistor. In an n-type enhancement transistor the body region 12 is p-doped, i.e. is doped complementarily to the source region 11 and the drain region 2. In a depletion transistor the body region 12 at least adjacent to the gate dielectric 14 includes an n-type channel region which extends from the source region 11 to the drift region 2 and which can be depleted of charge carriers by applying a suitable control potential at the gate terminal G. The first transistor 1 could also be implemented as a p-type enhancement or depletion transistor. In p-type transistors, the individual semiconductor regions are doped complementarily to the corresponding semiconductor regions in an n-type transistor.

Referring to FIG. 3, the active semiconductor regions of the second transistors are implemented in the drift region 2 or are implemented between the drift region 2 and a surface 101 of the semiconductor body 100. At this surface 101 the source 11 and drain 15 regions are connected to the source S and drain D terminals. In FIG. 3, only three second transistors $3_1$, $3_2$, $3_n$ are shown. However, this is only an example, the number n of second transistors is, of course, not limited to n=3.

The individual second transistors are implemented in identical manner, so that in FIG. 3 reference characters are only indicated for a first one $3_1$ of these second transistors. These second transistors $3_1$-$3_n$ each include a source region 41 and a drain region 42 arranged distant to the source region 41 in a lateral direction of the semiconductor body 100. A body region 43 is arranged between the source region 41 and the drain region 42. A gate electrode 44 is arranged adjacent to the body region 43 and dielectrically insulated from the body region 43 by a gate dielectric 45 serves to control a conducting channel between the source region 41 and the drain region 42. The source region 41 is electrically connected to a source electrode 51 which, in the embodiment of FIG. 3, also electrically contacts the body region 43. The drain region 42 is electrically connected to a drain electrode 52.

In the transistor arrangement of FIG. 3, the second transistors $3_1$-$3_n$ are arranged next to each other in the current flow direction of the first transistor 1. The "current flow direction" is the direction in which the source region 11 and the drain region 15 of the first transistor are arranged distant to each other.

The source electrode of one second transistor is connected with the drain electrode of one neighbouring second transistor, so that the second transistors $3_1$, $3_2$, $3_n$ are connected in series with each. Further, the source terminals of the individual second transistors $3_1$, $3_2$, $3_n$ are coupled to the drift region 2. For explanation purposes it is assumed that the first transistor is an n-type transistor and that the second transistors $3_1$, $3_2$, $3_n$ are also n-type transistors. In this case, the drain region 42 or the drain electrode 52 of each of the second transistors $3_1$-$3_n$ is arranged closer to the drain region 15 than the corresponding source region 41 of the transistor. Further, the drain region 42 or the drain electrode 52 is connected to the source region 41 or the drain electrode 52 of a neighbouring transistor which, in the embodiment of FIG. 3, is the neighbouring transistor in the direction of the drain electrode 15. For example, the drain region 42 of the second transistor $3_1$ is electrically connected to the source region of the neighbouring transistor $3_2$, wherein the transistor $3_2$ is the neighbouring transistor to transistor $3_1$ in the direction of the drain region 15.

In FIG. 3, the second transistors $3_1$-$3_n$ are planar transistors which have their gate electrode 44 arranged above the surface 101 of the semiconductor body 100. In these transistors the body region 43 is doped complementarily to the source region 41 and the drain region 42 and may include a doped channel region (illustrated in dotted lines) of the same doping type as the source region 41 and the drain region 42 and arranged between the source region 41 and the drain region 42 and adjacent to the gate dielectric 44. Through these source electrodes the individual second transistors, which are connected in series, are also connected in parallel with the drift region 2. For example, the second transistor $3_1$ is connected in parallel with a first section (represented by resistor $2_1$ in FIG. 3) of the drift region 2 via its source electrode 51 and the source electrode of the neighbouring second transistor $3_2$. The second transistor $3_n$ which of the plurality of second transistors $3_1$, $3_n$ is arranged closest to the drain region 15 has its drain electrode connected to the drain region 15 at the end of the drift zone of the first transistor with the drift zone 2.

Further, the second transistors $3_1$, $3_2$, $3_n$ have their gate electrodes coupled to the drift region 2. Referring to FIG. 3, except for the second transistor $3_1$ which is arranged closest to the body region 12 of the first transistor, the second transistors $3_2$, $3_n$ have their gate electrodes coupled to the source electrode of the neighbouring second transistor. In this case, the neighbouring transistor of one of the second transistors is the transistor which is arranged next to the one transistor in the direction of the body region. If, for example, $3_i$ denotes one of the second transistors and $3_{i-1}$ denotes a transistor which is arranged next to transistor $3_i$ in the direction of the body region 12, then transistor $3_i$ has its gate terminal connected to the source terminal of transistor $3_{i-1}$. However, this is only an example. One second transistor $3_i$ could also have its gate terminal connected to the source terminal of transistor $3_{i-2}$ or $3_{i-3}$ which is the second or third transistor as seen from the position of the transistor $3_i$ in the direction of the body region 12.

The second transistors $3_1$-$3_n$ are controlled by the voltage drop across the drift region 2 between those positions at which the source region and the gate electrode of the second transistors $3_1$-$3_n$ are coupled to the drift region 2. This voltage drop is usually low when the first transistor 1 is in its on-state and is usually high when the first transistor is in its off-state. The positions at which the gate electrodes 44 and the source regions 41 of the individual second transistors $3_1$-$3_n$ are coupled to the drift region 2 are selected such that when the first transistor is in the on-state the voltage drop between the source region 41 and the gate electrode 44 of each of the second transistors $3_1$-$3_n$ is suitable to switch the second transistors $3_1$-$3_n$ on, while when the first transistor 1 is in its off-state the (higher) voltage drop is suitable to switch the second transistors $3_1$-$3_n$ off. In the embodiment illustrated in FIG. 3, the first transistor can be an n-type transistor 1 and the second transistors $3_1$-$3_n$ can also be n-type transistors. In this case, the voltage drops between the gate electrode 44 and the source regions 41 of the second transistors $3_1$-$3_n$ are negative voltages which are low when the first transistor is on and which are high, when the first transistor is off. The second transistors are selected such that their threshold voltage is low enough that these transistors $3_1$-$3_n$ are switched on at low negative drive voltages.

In an n-type first transistor, the second transistors $3_1$-$3_n$ could also be implemented as p-type transistors. In this case, the gate electrodes of the individual second transistors will have to be connected to source terminals of the second transistors which are arranged in the direction of the drain region 15. These p-type transistors are implemented such that they are switched on at a low positive voltage and that are switched off at a higher positive voltage.

Figure 4:
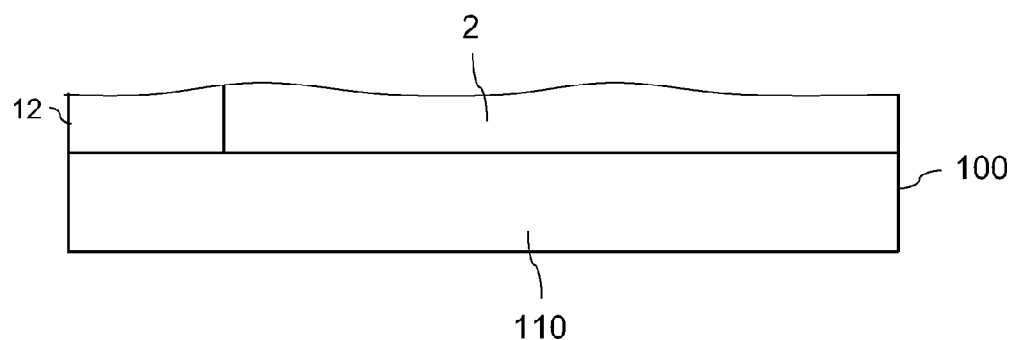
FIG. 4 schematically illustrates a first embodiment of a substrate section of the arrangement of FIG. 3.

In FIG. 3, only a semiconductor layer is illustrated in which the active semiconductor regions of the first and second transistors 1, $3_1$-$3_n$ are illustrated. This semiconductor layer can be arranged on any suitable substrate. Referring to FIG. 4, which only shows a lower section of the semiconductor layer with the active regions, the layer with the active regions of FIG. 3 can be arranged on a semiconductor substrate 110 which is doped complementarily to the drift region 2. The substrate could also extend to region 2, i.e. there is no drift zone doping.

Figure 5:
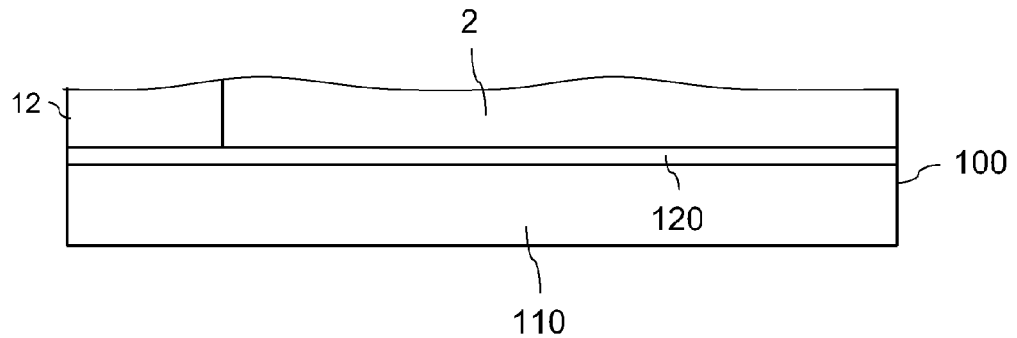
FIG. 5 schematically illustrates a second embodiment of a substrate section of the arrangement of FIG. 3.

Referring to FIG. 5, the semiconductor layer with the active regions can also be arranged on an SOI substrate. This SOI substrate includes a semiconductor substrate 110 and an insulation layer 120 arranged between the substrate 110 and the semiconductor layer with the active regions.

Figures 6A, 6B:
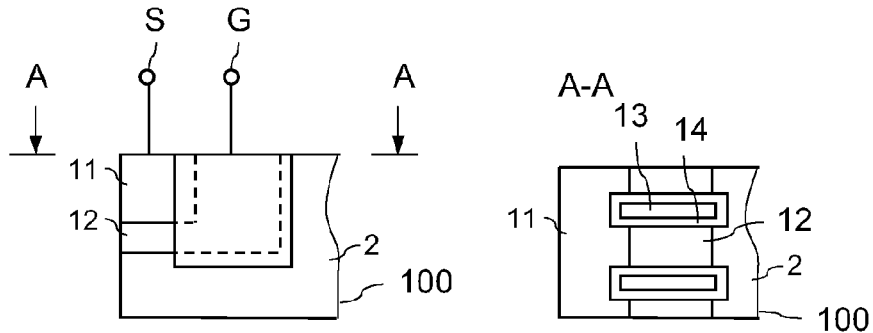
FIGS. 6A and 6B illustrates a further embodiment for implementing source and body regions and a gate electrode of the first transistor.

In FIG. 3, the first transistor has a planar gate electrode 13, which is a gate electrode which is arranged above the surface 101 of the semiconductor body 100. However, this is only an example. The first transistor 1 could be implemented with any other known gate topology as well. FIGS. 6A and 6B illustrate further embodiments of a gate topology of the first transistor. FIG. 6A shows a vertical cross section of the semiconductor body 100 in that region, in which the source region 11, the body region 12 and the gate electrode are arranged, and FIG. 6B illustrates a horizontal cross section in a section plane A-A shown in FIG. 6A. The drain region or a drain terminal is not shown in FIGS. 6A and 6B.

Referring to FIGS. 6A and 6B the gate electrode 13 is arranged in trenches which from the first surface 101 extend in a vertical direction of the semiconductor body 100. These trenches in a horizontal direction extend from the source region 11 to the drift region 2, wherein the body region 12 is arranged between these trenches and separates the source region 11 from the drift region 2. In a conventional manner, the gate electrode 13 is dielectrically insulated from the body region 12 (and the source and drift regions 11, 2) by the gate dielectric 14.

It should be noted that the second transistors $3_1$-$3_n$ can also be implemented with other geometries or topologies than illustrated in FIG. 3. Further illustrative embodiments for implementing these second transistors are illustrated in FIGS. 7A to 7C and 8A to 8B.

FIG. 7A shows a perspective view of a second transistor $3_i$ ($3_i$ represents any one of the second transistors explained before) implemented as a FINFET. FIG. 7B shows a vertical cross sectional view and FIG. 7C shows a horizontal cross sectional view of this second transistor. FIGS. 7A, 7B, 7C only show a section of the semiconductor body in which one second transistor is implemented. Active regions of the first transistor (besides a section of the drift region 2) and active regions of neighbouring second transistors are not shown.

Referring to FIG. 7A, the source, drain and body regions 41, 42, 43 of this transistor are arranged in a fin-like semiconductor section 130 (which will also be referred to as "semiconductor fin" in the following) above the drift region 2. In one horizontal direction, the source and drain regions 41, 42 extend from sidewall 131 to sidewall 132 of this fin-like semiconductor region 130. In a second direction which is perpendicular to the first direction the source and drain regions 41, 42 are arranged distant from each other and are separated by the body region 43. The gate electrode 44 (illustrated in dashed lines in FIG. 7A) is dielectrically insulated from the fin-like semiconductor region 130 by the gate dielectric 45 and is arranged adjacent to the body region 44 one of the sidewalls 131, 132 and a top surface 133 of this fin-like semiconductor region. In the embodiment illustrated in FIGS. 7A to 7C, the gate electrode 44 and the gate dielectric 45 are formed on each of the top surface 133 and each of the sidewalls 131, 132 of the semiconductor fin 130. However, this is only example, according to further embodiments (not shown), the gate electrode 44 and the gate dielectric 45 are only formed on the top surface 133 or only on at least one of the sidewalls 131, 132 of the semiconductor fin 130.

FIGS. 8A to 8B illustrate a further embodiment of one second transistor $3_i$ implemented as a FINFET having a semiconductor fin 130. The transistor $3_i$ according to FIGS. 8A to 8C is implemented as a U-shape-surround-gate-FINFET. FIG. 8A shows a vertical cross sectional view of the second transistor $3_i$ in a first vertical section plane E-E, FIG. 8B shows a horizontal cross sectional view of the second transistor $3_i$ in a horizontal section plane D-D, and FIG. 8C shows a vertical cross sectional view in a second vertical section plane F-F shown in FIG. 8B. The first vertical section plane E-E extends perpendicular to the top surface 133 of the semiconductor fin 130 and in a longitudinal direction of the semiconductor fin 130, the horizontal section plane D-D extends parallel to the top surface 133, and the second vertical section plane F-F extends perpendicular to the first vertical section plane E-E. In this transistor, the source region 41 and the drain region 42 also extend from sidewall 131 to sidewall 132 of the fin-like semiconductor region 130 in the first direction, and are arranged distant to each other in the second direction that is perpendicular to the first direction. In the embodiment illustrated in FIGS. 8A to 8C the second direction corresponds to the longitudinal direction of the semiconductor fin.

Referring to FIG. 8A, the source region 41 and the drain region 42 are separated by a trench which extends into the body region 43 from the top surface 133. The body region 43 is arranged below the source region 41 and the drain region 42 in the semiconductor fin 130. The gate electrode 44 is arranged adjacent to the body region 43 in the trench and along the sidewalls 131, 132 of the semiconductor fin 130 and is dielectrically insulated from the body region 43 by the gate dielectric 45. In an upper region, which is a region in which the gate electrode 44 is not arranged adjacent to the body region 43, the trench can be filled with a dielectric material 46.

The second transistor of FIGS. 8A to 8C is, for example, implemented as a depletion transistor, such as an n-type depletion transistor. In this case, the source and drain regions 41, 42 and the body region 43 have the same doping type, wherein the body region 43 usually has a lower doping concentration than the source and drain regions 41, 42. In order to be able to completely interrupt a conducting channel in the body region 43 between the source region 41 and the drain region 42, the gate electrode 44 along the sidewalls 131, 132 of the fin-like semiconductor region 130 completely extends along this semiconductor section 130 in the second direction. In the vertical direction the gate electrode 44 along the sidewalls 131, 132 extends from the source and drain regions 41, 42 to at least below the trench. According to one embodiment (not shown) the gate electrode 44 extends to the drift region 2.

Implementing the FINFETs illustrated in FIGS. 7A to 7C and 8A to 8C as U-shape-surround-gate-FINFET in which the gate electrode 44 has a U-shape and is arranged on sidewalls 131, 132 and on a top surface 133 of the semiconductor fin 130 is only an example. These FINFETs could also be modified (not illustrated) to have the gate electrode 44 implemented with two gate electrode sections arranged on the sidewalls 131, 132 but not on the top surface 133 of the semiconductor fin 130. A FINFET of this type can be referred to as double-gate FINFET. Each of the FINFETs explained above and below can be implemented as U-shape-surround-gate-FINFET or as double-gate FINFET. It is even possible to implement different types of FINFETs in one integrated circuit.

FIG. 9 illustrates a vertical cross section through a transistor arrangement in which the second transistors are implemented as FINFETs with a topology as illustrated in FIGS. 8A and 8B. FIG. 9 illustrates a cross section through the fin-like semiconductor region in which the source and drain regions of the individual second transistors $3_0$-$3_n$ are arranged. The source and drain regions as well as the body regions of neighboring second transistors are insulated from each other by dielectric layers 47 which extend in a vertical direction of the fin in which the source and drain regions of the second transistors are implemented.

In the embodiment of FIG. 9 the first transistor is also implemented as a FINFET. In this transistor the source region 11 and the drift region 2 are separated by the body region 12. The gate electrode 13 that is arranged in the trench and the position of which at the sidewalls of the semiconductor fin is illustrated by dotted lines, extends from the source region 11 across the body region 12 to the drift region 2. The source terminal S electrically contacts the source region 11 and the body region 12 at the top surface of the semiconductor fin of the first transistor 6. The source region 11 and the body region 12 of the first transistor are insulated from the active semiconductor regions of a first one $3_0$ of the second transistors by a dielectric layer 48.

In the embodiment illustrated in FIG. 9, the drift region can be implemented as a substrate on which the semiconductor fins of the first transistor 1 and the second transistors $3_0$-$3_n$ are arranged. According to another embodiment illustrated in dashed and dotted lines in FIG. 9, the drift region 2 in a lateral direction extends from below the body region 12 of the first transistor 1 to the drain zone 15, and adjoins a semiconductor layer 2' that is doped complementary. This layer 2' may extend to the body region 12 of the first transistor adjacent to the drift region 2 or may be connected to source potential, which is the electrical potential of the source region 11, at a position not illustrated in FIG. 9.

In the embodiment illustrated in FIG. 9, the first transistor 1 and the second transistors $3_0$-$3_n$ are implemented in one semiconductor fin, with the individual transistor being in line in a longitudinal direction of the semiconductor fin. The first transistor 1 and the second transistors connected in series $3_0$-$3_n$ may each include a number of transistor cells connected in parallel. This will be explained with reference to FIG. 10.

Figure 10:
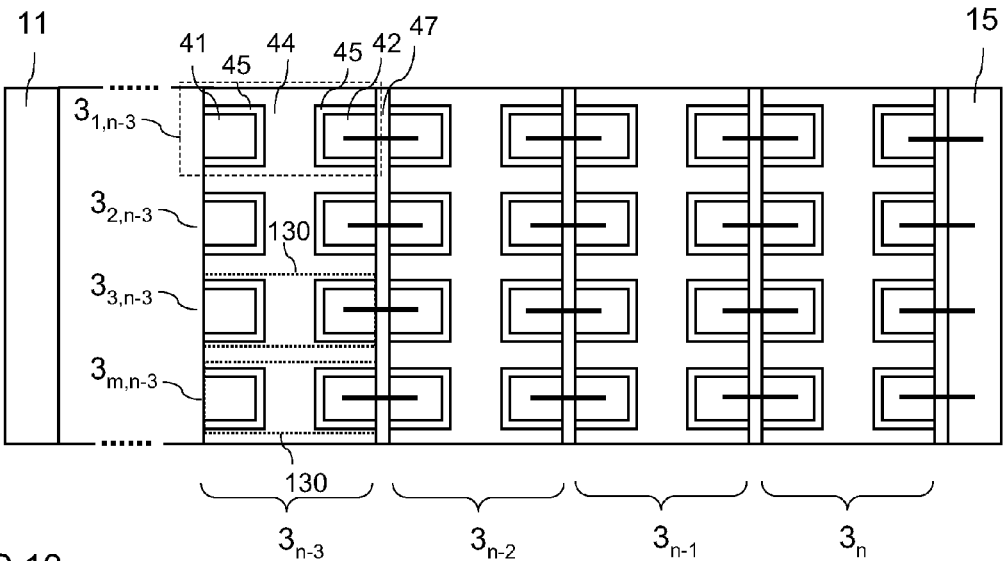
FIG. 10 illustrates a top view on a transistor arrangement in which the second transistors include several transistor cells connected in parallel.

FIG. 10 shows a top view of an arrangement with second transistors $3_{n-3}, 3_{n-2}, 3_{n-1}, 3_n$, wherein each of these transistors has a plurality of transistor cells which, for a transistor $3_{n-3}$, are denoted as $3_{1,n-3}, \ldots 3_{m,n-3}$ in FIG. 10. Each of these transistor cells, such as transistor cell $3_{1,n-3}$ is implemented as a FINFET with one of the topologies as explained before. The individual transistor cells of one transistor, such as transistor $3_{n-3}$ have a common gate electrode 44 which—in a manner not illustrated—is electrically connected to the source terminal of a neighboring second transistor. In FIG. 10, besides the arrangement with the plurality of second transistors only the drain region 15 the source region 11 are schematically illustrated. The second transistors $3_{n-3}$-$3_n$ illustrated in FIG. 10 are transistors arranged close to the drain region 15, wherein the second transistor $3_n$ is the second transistor which has its drain regions electrically connected to the drain region 15 of the first transistor. Electrical connections between the source and drain regions of the individual second transistors are illustrated by bold lines in FIG. 10. These electrical connections can be implemented using conventional techniques for electrically connecting semiconductor devices in an integrated circuit, such as conventional wiring arrangements.

In the embodiment illustrated in FIG. 10, the source and drain regions of the individual transistor cells are arranged distant to each other in the current flow direction of the first transistor. The current flow direction is a direction from the drain region 15 to the source region 11.

Figure 11:
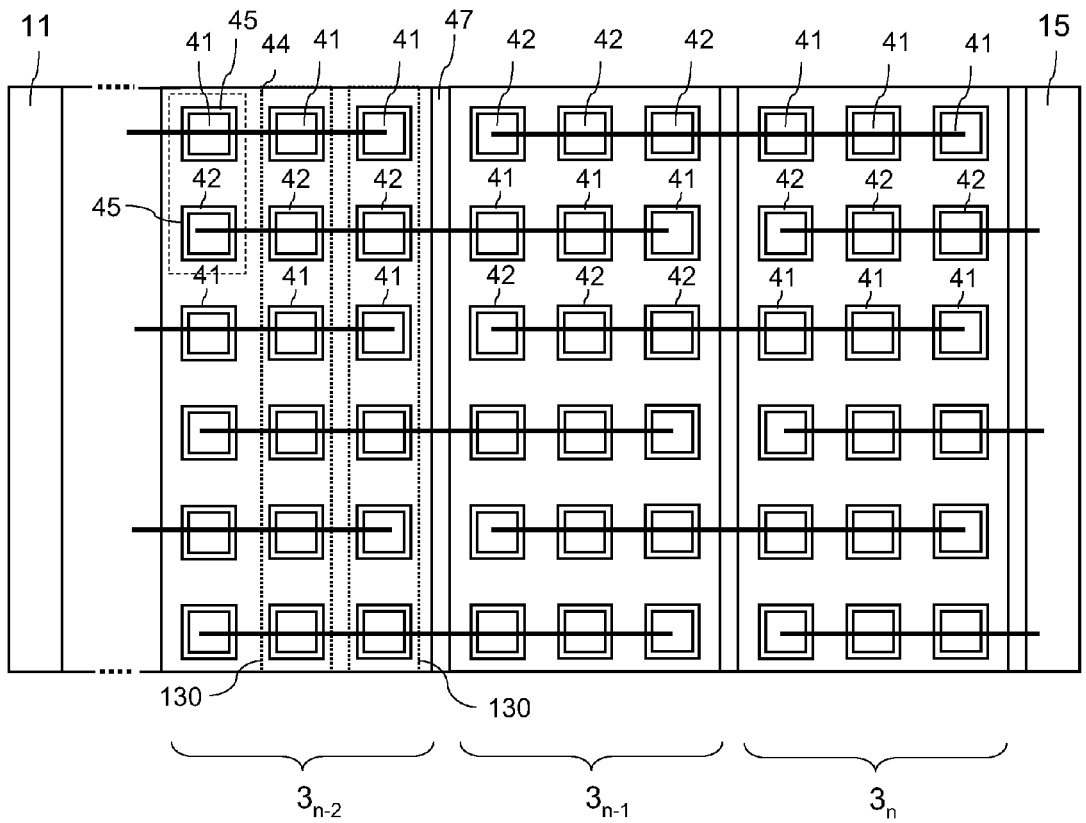
FIG. 11 illustrates a top view on a transistor arrangement according to a further embodiment in which the second transistors includes several transistor cells connected in parallel.

FIG. 11 illustrates a top view on a further embodiment of a second transistor arrangement. In this embodiment source and drain regions 41, 42 of the transistor cells of one second transistor $3_{n-2}, 3_{n-1}, 3_n$ are arranged distant in a direction perpendicular to the current flow direction. In this direction perpendicular to the current flow direction source and drain regions of the individual transistor cells are arranged alternatingly, so that two transistor cells that are adjacent in the direction perpendicular to the current flow direction have a common source region 41 and two transistor cells that are adjacent in the direction perpendicular to the current flow direction have a common drain region 42. The source regions 41 of one second transistor, such as transistor $3_{n-2}$, are electrically connected with the drain regions 42 of a neighboring transistor, such as transistor $3_{n-1}$. The individual transistor cells of one transistor have a common gate electrode 44. The gate electrode of one second transistor is electrically connected to the source region of a neighboring second transistor in a manner as explained in detail hereinbefore.

In FIGS. 10 and 11, which show top views of a section of an arrangement with second transistors, the semiconductor fins of the individual transistor cells are out of view. For two transistor cells and for two groups of transistor cells, respectively, the position of the semiconductor fins 130 is illustrated in dotted lines. In the embodiment illustrated in FIG. 9, the longitudinal directions corresponds to the current flow direction, while in the embodiment of FIG. 10, the longitudinal directions of the semiconductor fins run perpendicular to the current flow direction. The space between the semiconductor fins can be filled with gate electrode material, so as to form one contiguous gate electrode 44 for each second transistor $3_{n-2}, 3_{n-2}, 3_n$.

The active regions of the first transistor and the active regions of the second transistors can have conventional doping concentrations. In the first transistor 1, the doping concentration of the source and drain regions 11, 15 is, e.g., in the range of between $10^{19}$ cm$^{-3}$ and $10^{21}$ cm$^{-3}$, the doping concentration of the body region 12 is, e.g., in the range of between $10^{15}$ cm$^{-3}$ and $10^{19}$ cm$^{-3}$, and the doping concentration of the drift region 2 is, e.g., in the range of between $10^{13}$ cm$^{-3}$ and $10^{18}$ cm$^{-3}$.

In the second transistors $3_1$-$3_n$, the doping concentration of the source and drain regions 41, 42 is, e.g., in the range of between $10^{19}$ cm$^{-3}$ and $10^{21}$ cm$^{-3}$, and the doping concentration of the body region 12 is, e.g., in the range of between $10^{17}$ cm$^{-3}$ and $10^{20}$ cm$^{-3}$.

Figure 12:
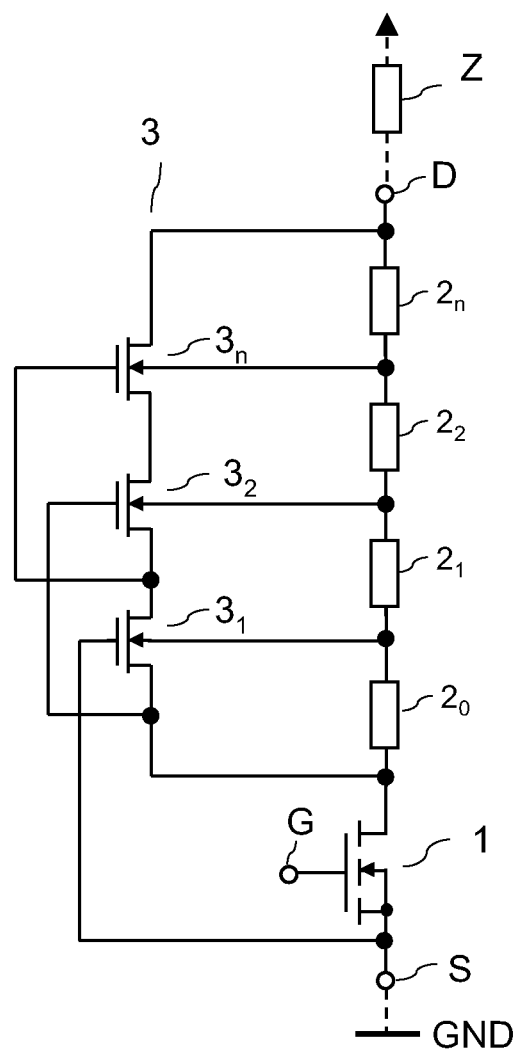
FIG. 12 illustrates a further embodiment of a transistor arrangement with a first transistor having a drift zone.

FIG. 12 illustrates a further embodiment of a transistor arrangement in which the second transistors $3_1$-$3_n$ are implemented as MOSFET, in particular as depletion MOSFET. Unlike the arrangement illustrated in FIG. 1, the second transistors of the arrangement of FIG. 12 are coupled to the drift region of the first transistor 1 via their bulk/body terminals instead of their source terminals. However, the second transistors $3_1$-$3_n$ have their load paths connected in series, and the gate terminal of one second transistor is connected to the source terminal of a neighbouring second transistor, wherein the second transistor $3_1$ that has its load path directly connected to the load path of the first transistor, has its gate terminal connected to the source terminal of the first transistor 1.

Figure 13:
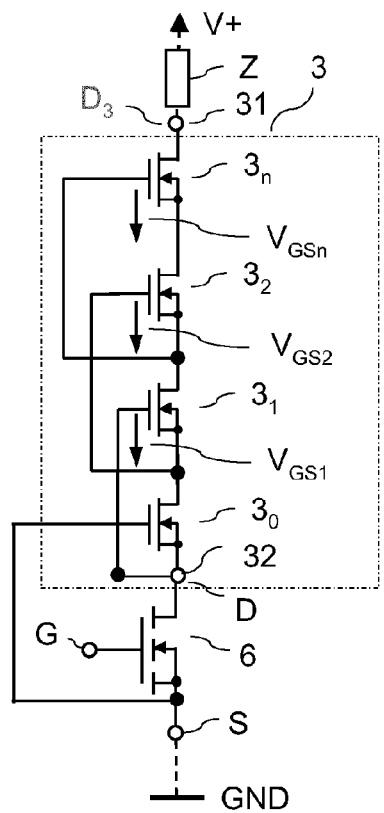
FIG. 13 illustrates another embodiment of a transistor arrangement with a first transistor and a plurality of second transistors.

FIG. 13 illustrates a further embodiment of a transistor arrangement. This transistor arrangement includes a first transistor 6 and an arrangement (second transistor arrangement) 3 with a plurality of second transistors $3_0$-$3_n$. The first transistor 6 has a load path between a first and a second load terminal and a control terminal, and each of the second transistors has a load path between a first and a second load terminal and a control terminal. The second transistors $3_0$-$3_n$ have their load paths connected in series between first and second terminals 31, 32, wherein a series circuit with the load paths of the second transistors $3_0$-$3_n$ is connected in series with the load path of the first transistor 1. The first transistor 6 can be a power transistor with a drift zone (not illustrated) but could also be a low-voltage transistor without a drift region.

Each of the second transistors $3_0$-$3_n$ has its control terminal connected to the load terminal of another one of the second transistors $3_0$-$3_n$ or to one of the load terminals of the first transistor 6. In the embodiment illustrated in FIG. 13 a first one $3_0$ of the second transistors which is adjacent to the first transistor 6 so that it has its load path directly connected to the load path of the first transistor 6 has its control terminal connected to a first load terminal of the first transistor 6. The other second transistors, which are transistors $3_1$-$3_n$ in the embodiment illustrated in FIG. 13, have their control terminals connected to the first load terminal of the adjacent second transistor. The connection of the control terminals of the second transistors to the load terminals of the first transistor 1 or to the load terminals of another one of the second transistors is such that the first one $3_0$ of the second transistors has a drive voltage which corresponds to the voltage across the load path of the first transistor 6, and such that the drive voltages of the other second transistors correspond to the voltage across the load path of an adjacent second transistor.

In the embodiment illustrated in FIG. 13, the first transistor 6 and the second transistors $3_0$-$3_n$ are MOSFET which each have a gate terminal that forms a control terminal, and a drain and source terminal, wherein the drain and source terminals form load path terminals. The first one $3_0$ of the second transistors has its gate terminal connected to the source terminal of the first transistor, and the other second transistors $3_1$-$3_n$ have their gate terminals connected to the source terminal of an adjacent one of the second transistors. The first transistor 1 is an enhancement MOSFET, such as an n-type enhancement MOSFET, and the second transistors $3_0$-$3_n$ are depletion MOSFET, such as n-type depletion MOSFETs, in this embodiment. However, the circuit is not restricted to be implemented with n-type transistors but may be implemented with p-type transistors as well.

The transistor arrangement with the first transistor 1 and a second transistor $3_0$-$3_n$ can be switched on and off like a conventional transistor by applying a suitable drive voltage to the first transistor 6. The operating principle will now shortly be explained: Assume that the arrangement is first in its on-state, so that the first transistor 1 and the second transistors are conducting and the first transistor 1 is switched off. In this case, a voltage drop across the load path of the first transistor 1 increases, thereby switching off the first one $3_0$ of the second transistors. When this second transistor is switched off, the voltage drop across its load path increases so that a second one $3_1$ of the second transistors is switched off, which in turn switches a third one $3_2$ of the second transistors off, etc. This continues until all of the second transistors $3_0$-$3_n$ are switched off.

When the arrangement is in its off-state and the first transistor is switched on, a decreasing voltage drop across the load path of the first transistor 1 switches the first one $3_0$ of the second transistors on, which in turn switches the second one of the second transistors $3_1$ on, etc. This continues until all of the second transistors $3_0$-$3_n$ are switched on.

The switching states of the second transistors $3_0$-$3_n$ connected in series with the first transistor 6 are dependent on the switching state of the first transistor 6, where the arrangement with the second transistors $3_0$-$3_n$ has a high resistance when the first transistors is switched off and has a low resistance when the first transistor 6 is switched on. In the following, the arrangement with the second transistors will be referred to as active drift region, where the terminal 31 that corresponds to a drain terminal of the second transistor $3_n$ will be referred to as drain terminal $D_3$ of the active drift region 3.

Figure 14A:
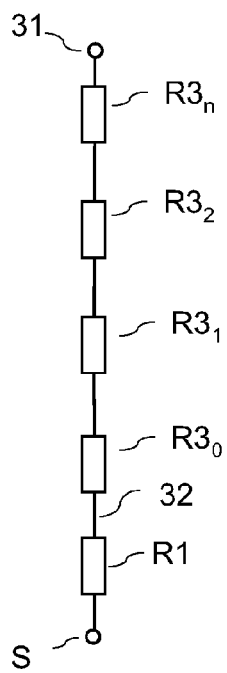
FIGS. 14A and 14B, show the equivalent circuit diagrams of the transistor arrangement of FIG. 13 when the first transistor is switched on (FIG. 14A) and when the first transistor is switched off (FIG. 14B).
Figure 14B:
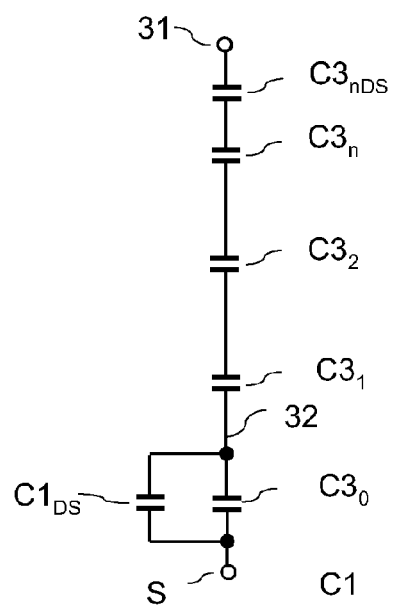

The voltage blocking capability of the overall transistor arrangement is, however, higher than the voltage blocking capability of only the first transistor 6. In its on-state, the transistor arrangement behaves like a series circuit of resistors, which is illustrated in FIG. 14A. The individual resistors R1 and $R3_0$-$R3_n$ each represent the on-resistances of the individual transistors connected in series. In the off-state the transistor arrangement behaves like a series circuit with capacitors $C3_0$-$C3_n$, wherein each of the capacitors represents the gate-source-capacitance of one of the transistors connected in series. The capacitor $C1_{DS}$ connected in parallel with the gate-source-capacitance $C3_0$ of the first one of the second transistors represents the drain-source-capacitance of the first transistor 1. The capacitor $C3_{nDS}$ connected between the gate-source-capacitance $C3_n$ of the second transistor $3_n$ represents the drain-source-capacitance of the second transistor $3_n$. The drain-source-capacitances of the other second transistors are not explicitly shown in FIG. 14B.

In the embodiment illustrated in FIG. 13, the first transistor 6 is a normally-off (enhancement) transistor, while the second transistor $3_0$-$3_n$ are normally-on (depletion) transistors. However, this is only an example. Each of the first transistor and the second transistors can be implemented as a normally-on transistor or as a normally-off transistor. Furthermore, the individual transistors can be implemented as n-type transistors or p-type transistors.

Figure 15:
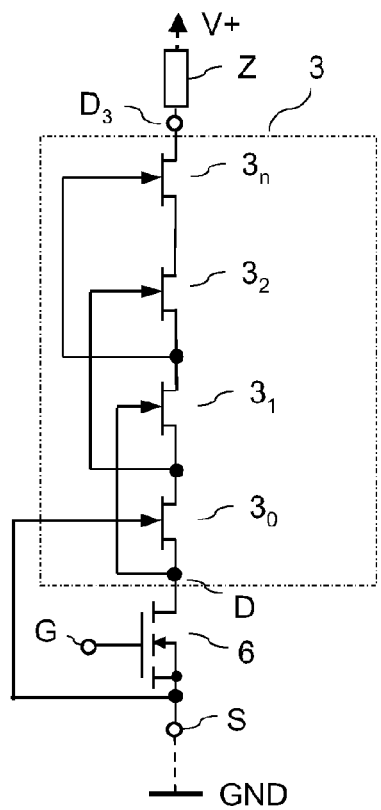
FIG. 15 illustrates an embodiment of the arrangement of FIG. 13 in which the second transistors are implemented as JFETs.
Figure 16:
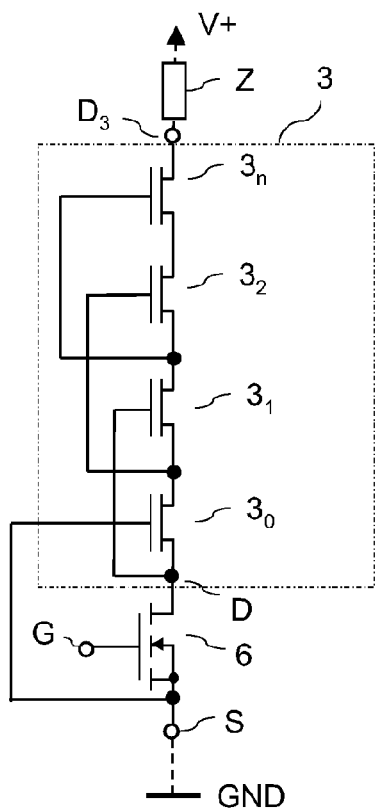
FIG. 16 illustrates an embodiment of the arrangement of FIG. 13 in which the second transistors are implemented as nanotube devices or HEMTS.

Further, any type of transistor can be used to implement the first transistor 1 and the second transistors $3_0$-$3_n$, like a MOSFET, a MISFET, a MESFET, an IGBT, a JFET, a FINFET, a nanotube device, or an HEMT, etc. FIG. 15 illustrates an embodiment in which the first transistor 6 is an (n-type) enhancement transistor while the second transistors are n-type JFET. Of course, the arrangement could also be implemented with p-type transistors as the first transistor 6 and the second transistors $3_0$-$3_n$. FIG. 16 illustrates an embodiment in which the first transistor 6 is an (n-type) enhancement transistor while the second transistors are nanotube devices or HEMTs.

The operating principle of the semiconductor arrangement is explained in the following. Just for explanation purposes it is assumed that the first semiconductor device 6 is implemented as an n-type enhancement MOSFET, that the second transistors $3_0$-$3_n$ are implemented as n-type depletion MOSFETs or n-type JFETs, and that the individual devices 2, $3_i$ are interconnected as illustrated in FIG. 1. The basic operating principle, however, also applies to semiconductor device arrangements implemented with other types of first and second semiconductor devices.

It is commonly known that depletion MOSFETs or JFETs, that can be used to implement the second transistors $3_i$, are semiconductor devices that are in an on-state when a drive voltage (gate-source voltage) of about zero is applied, while MOSFETs or JFETs are in an off-state when the absolute value of the drive voltage is higher than a pinch-off voltage of the device. The "drive voltage" is the voltage between the gate terminal and the source terminal of the device. In an n-type MOSFET or JFET the pinch-off voltage is a negative voltage, while the pinch-off voltage is a positive voltage in a p-type MOSFET or JFET.

When a (positive) voltage is applied between the first terminal 31 of the second transistor arrangement 3 and a first load terminal (source terminal) S of the first semiconductor device 6 (which can be referred to as first and second external terminals) and when the first semiconductor device 6 is switched on by applying a suitable drive potential to the control terminal G, the 1st second transistor $3_0$ is conducting (in an on-state), the absolute value of the voltage across the load path (drain-source path) D-S of the first semiconductor device 6 is too low so as to pinch-off the 1st second transistor $3_0$. Consequently, the 2nd second transistor $3_1$ controlled by the load path voltage of the 1st second transistor $3_0$ is also starting to conduct, etc. In other words, the first semiconductor device 6 and each of the second transistors $3_i$ are finally conducting so that the semiconductor arrangement is in an on-state. When the semiconductor arrangement 1 is in an on-state and when the first semiconductor device 6 is switched off, the voltage drop across the load path of the first semiconductor device 6 increases, so that the 1st second transistor $3_0$ starts to switch off when the absolute value of the load-path voltage of the first semiconductor device 6 reaches the pinch-off voltage of the 1st second transistor $3_0$. When a positive voltage is applied between the first and second external terminals 31, S, the voltage between the second load terminal (drain terminal) D and the first load terminal S of the first semiconductor device 6 is also a positive voltage when the first semiconductor device 6 switches off. In this case, the gate-source voltage of the 1st second transistor $3_0$ is a negative voltage suitable to pinch off this transistor $3_0$.

When the 1st second transistor $3_0$ is switched off, the voltage drop across its load path increases so that the 2nd second transistor $3_1$ is switched off, which in turn switches off the 3rd second transistor $3_2$, and so on, until each of the second transistors $3_i$ is switched off and the semiconductor device arrangement is finally in a stable off-state. The external voltage applied between the first and second external terminals 31, S switches as many 2nd transistors from the on-state to the off-state as required to distribute the external voltage over the first semiconductor device 6 and the second transistors $3_i$. When applying a low external voltage, some second transistor are still in the on-state, while others are in the off-state. The number of second transistors $3_i$ that are in the off-state increases as the external voltage increases. Thus, when a high external voltage is applied, that is in the range of the voltage blocking capability of the overall semiconductor device arrangement, the first semiconductor device and each of the second transistors are in the off-state.

When the semiconductor device arrangement with the first semiconductor device 6 and the second transistors $3_i$ is in an off-state and when the first semiconductor device 6 is switched on, the voltage drop across the load path of the first semiconductor device 6 decreases so that it switches on the 1st second transistor $3_0$, which in turn switches on the 2nd second transistor $3_1$, and so on. This continues until each of the second transistors $3_i$ is again switched on.

The switching states of the second transistors $3_i$ connected in series with the first semiconductor device 6 are dependent on the switching state of the first semiconductor device 6 and follow the switching state of the first semiconductor device 6. Thus, the switching state of the overall semiconductor device arrangement is defined by the switching state of the first semiconductor device 6. The semiconductor device arrangement is in an on-state when the first semiconductor device 6 is in an on-state, and the semiconductor device arrangement is in an off-state when the first semiconductor device 6 is in an off-state.

The semiconductor device arrangement has a low resistance between the first and second external terminals 31, S, and has a high resistance between the first and second external terminals 31, S when it is in an off-state. In the on-state, an ohmic resistance between the first and second external terminals 31, S corresponds to the sum of the on-resistances $R_{ON}$ of the first semiconductor device 6 and the second transistors $3_i$. A voltage blocking capability (which is the maximum voltage that can be applied between the first and second external terminals 31, S when the semiconductor arrangement is in an off-state before an Avalanche breakthrough sets in) corresponds to the sum of the voltage blocking capabilities of the first semiconductor device 6 and the second transistors $3_i$. The first semiconductor device 6 and the individual second transistors $3_i$ may have relatively low voltage blocking capabilities, such as voltage blocking capabilities of between 3V and 50V. However, dependent on the number n of second transistors 3 a high overall voltage blocking capability of up to several 100V, such as 600V or more, can be obtained.

The voltage blocking capability and the on-resistance of the semiconductor device arrangement are defined by the voltage blocking capabilities of the first semiconductor device 6 and the second transistors $3_i$ and by the on-resistances of the first semiconductor device 6 and the second transistors $3_i$, respectively. When significantly more than two second transistors $3_i$ are implemented (n>>2), such as more than 5, more than 10, or even more than 20 second transistors $3_i$ are implemented, the voltage blocking capability and the on-resistance of the semiconductor arrangement are mainly defined by the arrangement 3 with the second transistors $3_i$. The overall semiconductor device arrangement 1 can be operated like a conventional power transistor, where in a conventional power transistor, an integrated drift region mainly defines the on-resistance and the voltage blocking capability. Thus, the arrangement 3 with the second transistors $3_i$ has a function that is equivalent to the drift region in a conventional power transistor. The arrangement 3 with the second transistors $3_i$ can, therefore, be referred to as active drift region (ADR). The overall semiconductor device arrangements of FIG. 13, but also the semiconductor device arrangement of FIG. 1 that has an active drift region connected in parallel with the drift region of a power transistor 1, can be referred to as ADR transistor, or as ADRFET, when the first semiconductor device is implemented as a MOSFET.

Figure 17:
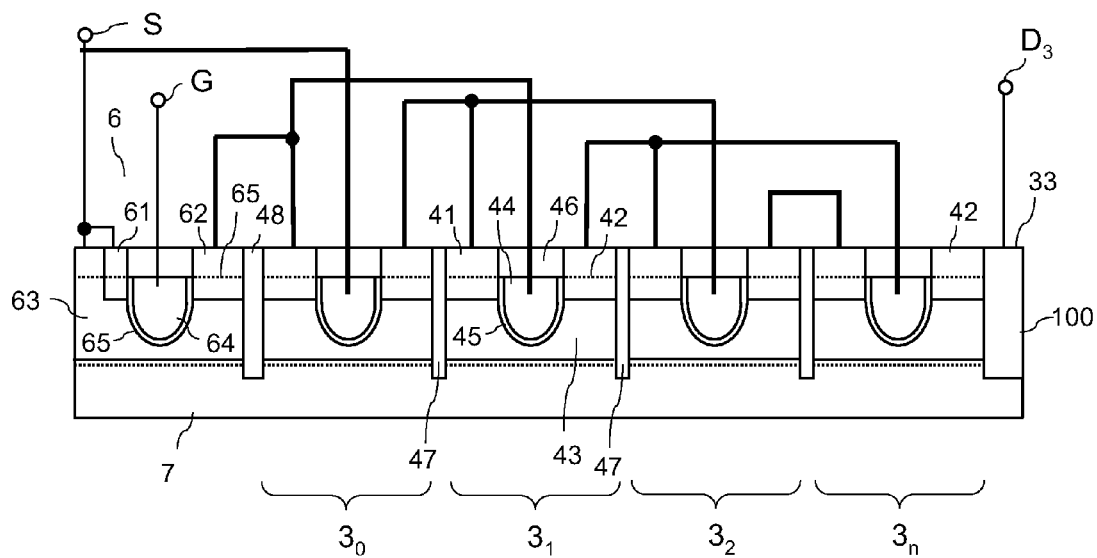
FIG. 17 illustrates a first embodiment of an integrated circuit that includes a circuit arrangement according to FIG. 13.

Like the circuit arrangement illustrated in FIG. 1 that has the second transistors $3_0$-$3_n$ connected in parallel with the drift region $2_0$-$2_n$ of the power transistor 1, the circuit arrangement illustrated in FIG. 13 that has the second transistors $3_0$-$3_n$ connected in series with the load path D-S of the first transistor 6 can be implemented in one semiconductor body. FIG. 17 illustrates a first embodiment of a semiconductor body 100, in which a circuit arrangement with a first transistor 6 and a plurality of second transistors $3_0$-$3_n$ are integrated. Specifically, FIG. 17 illustrates a vertical cross sectional view of a semiconductor fin in which active regions (source, drain and body regions) of a first semiconductor device 6 and of n+1 second transistors $3_0$-$3_n$ are arranged.

The embodiment illustrated in FIG. 17 is based on the embodiment illustrated in FIG. 9. In the circuit arrangement or integrated circuit illustrated in FIG. 17, the first transistor 6 and each of the second transistors $3_0$-$3_n$ are implemented as FINFETs, specifically as U-trench surround-gate FINFETs. FIG. 17 illustrates a vertical cross sectional view of the semiconductor body 100 in a vertical section plane that extends through the semiconductor fins of the individual FINFETs in the longitudinal direction of the individual semiconductor fins. The second transistors $3_0$-$3_n$ are implemented as explained with reference to FIGS. 8A to 8C herein before, with the difference, that body regions 43 of the individual FINFETs are not arranged above the drift region (2 in FIGS. 8A to 8C) of a power transistor, but are arranged on a substrate 7. This substrate 7 can be implemented in a number of different ways as will be explained with reference to FIGS. 18 and 19 below. The individual second transistors $3_0$-$3_n$ can be identical; in FIG. 17 reference characters for only one of the plurality of second transistors, namely for the transistor $3_1$ are indicated.

The first transistor 6, like the second transistors $3_0$-$3_n$, is also implemented as a U-trench surround-gate FINFET in the embodiment illustrated in FIG. 17. However, the first transistor 6 as well as the second transistors $3_0$-$3_n$ could be implemented as double-gate FINFETs as well. It is even possible, to implement the first transistor 6 and the second transistors $3_0$-$3_n$ as different types of transistors.

Referring to FIG. 17, a source region 61 and a drain region 62 of the first transistor 6 are arranged distant to each other in a longitudinal direction of the semiconductor fin, where the source and drain regions 61, 62 are separated by the U-trench, which from a top surface of the semiconductor fin of the first transistor 6 extends into the semiconductor fin. In the U-trench and along the sidewalls (not shown in FIG. 17) of the semiconductor fin a gate electrode 64 and a gate dielectric 65 are arranged, so that the gate electrode 65 is adjacent to a body region 63 of the first transistor 6, wherein the body region 63 is arranged below the source and drain regions 61, 62 and also below the U-trench. The position of the gate electrode 64 and the gate dielectric 65 along one sidewall of the semiconductor fin is indicated in dotted line for the first transistor 6 as well as for the second transistors $3_0$-$3_n$ in FIG. 17.

The first transistor 6 is, for example, implemented as an enhancement transistor. In this case, the source region 61 and the drain region 62 have a first doping type, such as, for example, an n-type, and the body region 63 has a second doping type, such as, for example, a p-type. The source region 61 and the body region 63 are both connected to the source terminal S, which is only schematically illustrated in FIG. 17. In the integrated circuit according to FIG. 17, the first transistor 6 and the second transistors $3_0$-$3_n$ are arranged such that longitudinal directions of the semiconductor fins of the individual transistors are in-line, so that a first one $3_0$ of the second transistors adjoins the first transistor 6 in a direction corresponding to a longitudinal direction of the semiconductor fin of the first transistor 1, a second one $3_1$ of the second transistors adjoins the first one $3_0$ of the second transistor in a direction corresponding to the longitudinal direction of the semiconductor fin of the first one $3_0$ of the second transistors, etc. The semiconductor fins of the individual second transistors $3_0$, $3_n$ are insulated from each other by insulation layers 47 extending from the top surface of the semiconductor fins through the semiconductor fin down to the substrate 7. The semiconductor fin including the active transistor regions of the first transistor 6 is insulated from the semiconductor fin including the active transistor regions of the first one $3_0$ of the second transistors by a further insulation layer 48 extending from the top surface of the semiconductor fin down to the substrate 7. The drain region of the first transistor 6 is located at a first longitudinal end of the semiconductor fin of the first transistor 6, wherein the first longitudinal end is the longitudinal end that faces towards the semiconductor fin of the first one $3_0$ of the second transistors. The source region 61 of the first transistor 6 is arranged at a second longitudinal end of the semiconductor fin of the first transistor 6, where the second longitudinal end faces away from the semiconductor fin of the first one $3_0$ of the second transistors. At this second longitudinal end, the body region 63 extends to the top surface of the semiconductor fin and is connected to the source terminal S at this top surface. However, this is only an example. The source terminal could also include a contact electrode extending through the source region 61 into the body region 63 and connecting both, the source region 61 and the body region 63.

Like in FIG. 13, $D_3$ in FIG. 17 denotes a drain terminal of the circuit arrangement that is formed by a drain terminal of a last one $3_n$ of the second transistors in the chain of second transistors $3_0$-$3_n$. In the embodiment illustrated in FIG. 17, a first semiconductor region 33 of the same doping type as the drain region 42 of the second transistor $3_n$ adjoins the drain region 42 of the second transistor $3_n$ and is connected to the drain terminal $D_3$. This drain terminal $D_3$ is the drain terminal of the active drift region.

According to one embodiment, the first transistor 6 is implemented as an n-type enhancement transistor, while the second transistors $3_0$-$3_n$ are implemented as n-type depletion transistors. A gate electrode of the first one $3_0$ of the second transistors is electrically connected to the source terminal S of the first transistor 6, and the source region of this first one $3_0$ of the second transistor is electrically connected to the drain region 62 of the first transistor 6. From the other second transistors $3_1$-$3_n$ each one has its gate terminal connected to the source terminal of a neighboring second transistor arranged in the direction of the first transistor 6 and has its source terminal connected to the drain terminal of this neighboring second transistor. For example, the second transistor $3_2$ has its gate electrode connected to the source terminal of second transistor $3_1$ and has source terminal connected to the drain terminal or drain region of the second transistor $3_1$.

In the same way as explained with reference to FIGS. 10 and 11, each of the second transistors $3_0$-$3_n$ may include a plurality of transistor cells connected in parallel. Longitudinal directions of the semiconductor fins of the individual transistor cells of two neighboring second transistors may be arranged in line, as illustrated in FIG. 10. However, it is also possible for the longitudinal directions of the semiconductor fins of two neighboring second transistors, such as, for example, the transistors $3_{n-1}$ and $3_n$ of FIG. 11 to be arranged in parallel with each other.

Referring to FIG. 17, the substrate 7 can be implemented as a semiconductor substrate of a doping type complementary to the doping type of the body regions 43 of the second transistors $3_0$-$3_n$. The substrate 7 is arranged below the first transistor 6 and each of the second transistors $3_0$-$3_n$ and may adjoin the body region 63 of the first transistor 6 as well as the body region 43 of the second transistors $3_0$-$3_n$.

Figure 18:
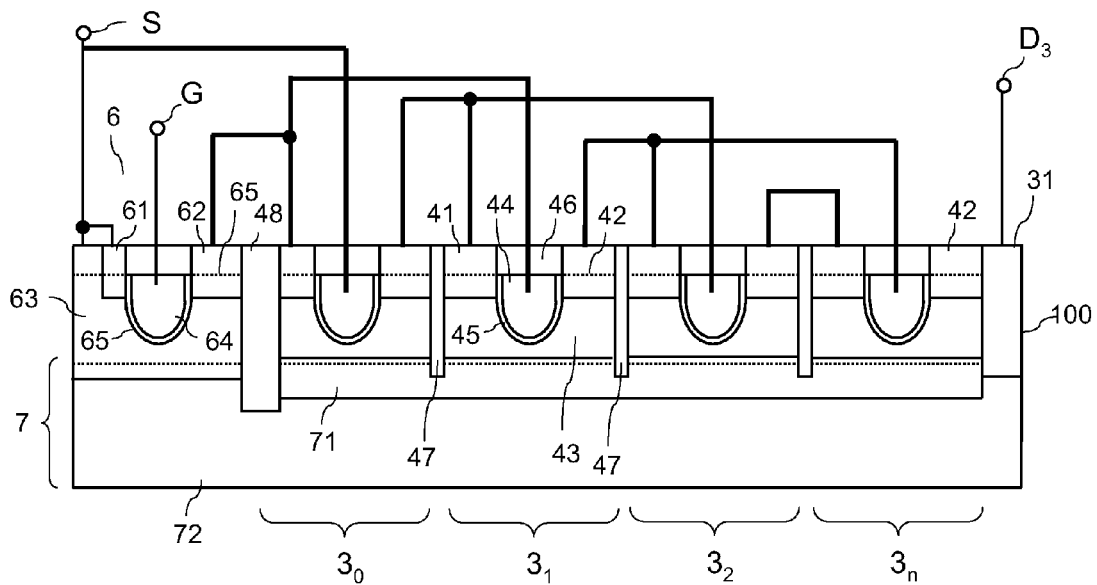
FIG. 18 illustrates a second embodiment of an integrated circuit that includes a circuit arrangement according to FIG. 13.

FIG. 18 illustrates a further embodiment of an integrated circuit including a first transistor 6 and a plurality of second transistors $3_0$-$3_n$. The integrated circuit of FIG. 18 is a modification of the integrated circuit of FIG. 17, wherein in the integrated circuit according to FIG. 18 a substrate 7 includes a first section 71 of a doping type complementary to the doping type of the body regions 43 of the second transistors $3_0$-$3_n$. This first section 71 is arranged below the body regions 43 of the second transistors $3_0$-$3_n$ and also below the insulation layers 47, so as to form a continuous semiconductor region 71 that extends in a lateral or horizontal direction of the semiconductor body 100. The first section 71 of the substrate 7 does not extend below the first transistor 6, where the further insulation layer 48 extends deeper into the semiconductor body 100 than the insulation layer 47, so as to separate the first section 71 from those regions of the semiconductor body 100 in which the first transistor 6 is implemented. The substrate 7 further includes a second section 72 doped complementarily to the first section 71, wherein this second section 72 adjoins the body region 63 of the first transistor 6 and extends in lateral or horizontal direction of the semiconductor body 100 below the first transistor 6 and each of the second transistors $3_0$-$3_n$.

The first and second sections 71, 72 of the substrate 7 provide a junction isolation between the second transistors $3_0$-$3_n$ and the first transistor 6. Further, the first section 71 of the substrate 7 and the body regions 43 provide a junction insulation between the second transistors $3_0$-$3_n$. In the embodiment illustrated in FIG. 18, the insulation layer 48 separating the first transistor 6 and a first one $3_0$ of the second transistors $3_0$-$3_n$ extends form a first surface of the semiconductor body 100 into the semiconductor body 100 and into the second substrate section 72. This insulation layer 48 may extend deeper into the semiconductor body 100 than the insulation layers 47 separating the individual second transistors $3_0$-$3_n$.

According to a further embodiment (not illustrated) the insulation layer 48 extends through the second substrate section 72 in a vertical direction of the semiconductor body 100 to a second surface of the semiconductor body 100 opposite the first surface.

The insulation layers 47, 48 may completely be comprised of a dielectric material. However, according to a further embodiment, the insulation layers include a dielectric material along sidewalls and a bottom of trenches in which the insulation layers are formed, and an electrically conducting material, such as a metal or a polysilicon, filling the trenches.

According to a further embodiment, the first substrate section 71 of FIG. 18 has the same doping type as the body regions 43 of the second transistors $3_0$-$3_n$ and the second substrate section 72 is doped complementarily to the first substrate section 71 and the body regions.

Figure 19:
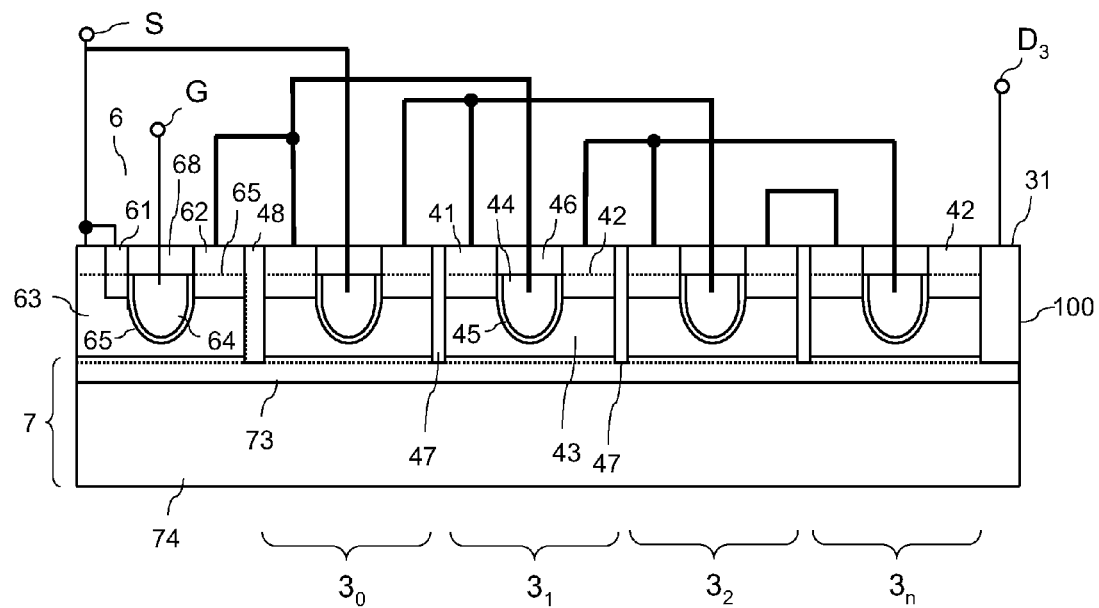
FIG. 19 illustrates a third embodiment of an integrated circuit that includes a circuit arrangement according to FIG. 13.

FIG. 19 illustrates a further embodiment of an integrated circuit. In this embodiment, the substrate 7 is implemented as an SOI-substrate and includes an insulation layer 73 adjoining the body regions 43 of the second transistors $3_0$-$3_n$ and the body region 63 of the first transistor 6 and extending in a lateral or horizontal direction of the semiconductor body 100. The insulation layer 73 is arranged on a semiconductor substrate 74 of a first or a second doping type.

Each of the first semiconductor device 6 and the second transistors 3 (referred to as devices in the following) may include a plurality of identical cells (transistor cells) that are connected in parallel. Each of these cells can be implemented as FINFET. Providing a plurality of cells connected in parallel in one device can help to increase the current bearing capability and to reduce the on-resistance of the individual device.

Figure 20:
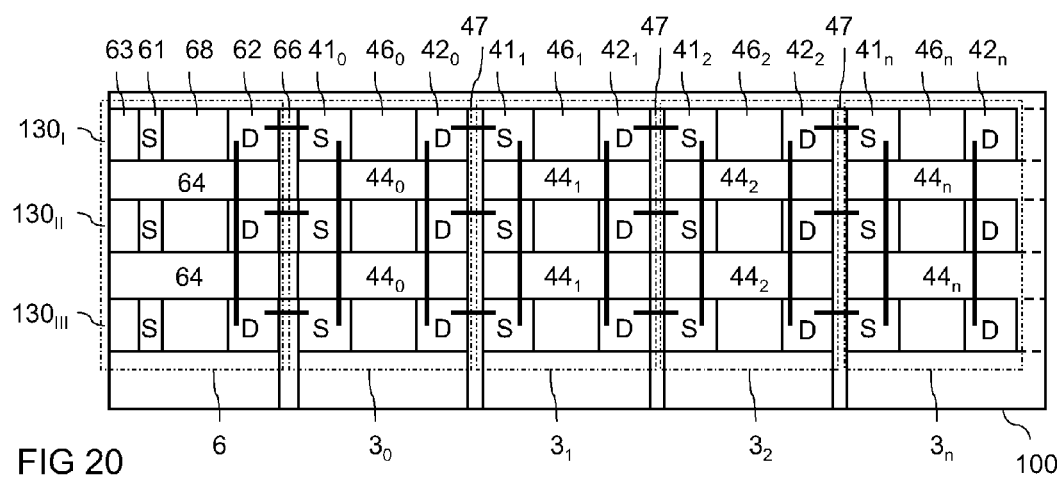
FIG. 20 illustrates a top view of a semiconductor body according in which a first semiconductor device and a plurality of second semiconductor devices each including several FINFET cells are implemented.

FIG. 20 illustrates a top view on a semiconductor arrangement according to a first embodiment which includes a first semiconductor device 6 and a plurality of second transistors $3_i$, with each of these devices having a plurality (from which three are illustrated) cells connected in parallel. The individual cells of one device are implemented in different semiconductor fins $130_I$, $130_{II}$, $130_{III}$. Each of these cells has a source region 61, $41_i$ that is additionally labeled with "S" in FIG. 19, and a drain region 62, $42_i$ that is additionally labeled with "D" in FIG. 20. The cells of one device are connected in parallel by having the source regions of the one device connected together and by having the drain regions of the one device connected together. These connections as well as connections between the load terminals of the different devices are schematically illustrated in bold lines in FIG. 20. Connections between the control terminals (gate terminals) and the load terminals of the different devices are not illustrated in FIG. 20. The connections between the cells and the different devices can be implemented using conventional wiring arrangements arranged above the semiconductor body and contacting the individual active regions (source and drain regions) through vias. Those wiring arrangements are commonly known so that no further explanations are required in this regard. The individual cells of one device 6, $3_0$, $3_1$, $3_2$, $3_n$ have a common gate electrode 64, $44_0$, $44_1$, $44_2$, $44_n$ arranged in the U-shaped trenches of the individual semiconductor fins and in trenches between the individual fins. These "trenches between the fins" are longitudinal trenches along the fins $130_I$, $130_{II}$, $130_{III}$.

Figure 21:
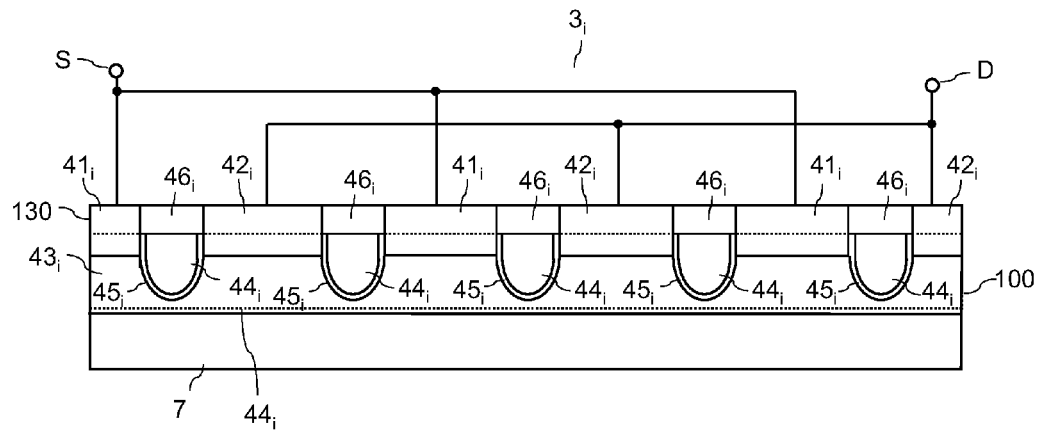
FIG. 21 illustrates a vertical cross sectional view of one second semiconductor device including several FINFET cells connected in parallel.

FIG. 21 illustrates a further embodiment for implementing one second transistor $3_i$ with a plurality of transistor cells. In this embodiment, a plurality of transistor cells of the second transistor $3_i$ are implemented in one semiconductor fin 130. In the longitudinal direction of the semiconductor fin 130, source and drain regions $41_i$, $42_i$ are arranged alternately with a source region $41_i$ and a neighboring drain region $42_i$ being separated by one (U-shaped) trench that accommodates the gate electrode $44_i$. The source regions $41_i$ are connected to the first load terminal (source terminal) S of the second transistor $3_i$, and the drain regions $42_i$ are connected to the second load terminal (drain terminal) D of the second transistor $3_i$, so that the individual transistor cells are connected in parallel. The gate electrode 44 is common to the individual transistor cells and extends along the sidewalls of the semiconductor fin 130 in the longitudinal direction. Each source region 41 and each drain region 42 (except for the source and drain regions arranged at the longitudinal ends of the semiconductor fin 130) is common to two neighboring transistor cells.

The concept of providing several transistor cells in one semiconductor fin explained with reference to FIG. 21 is, of course, also applicable to the implementation of the first semiconductor device 6.

Figure 22A:
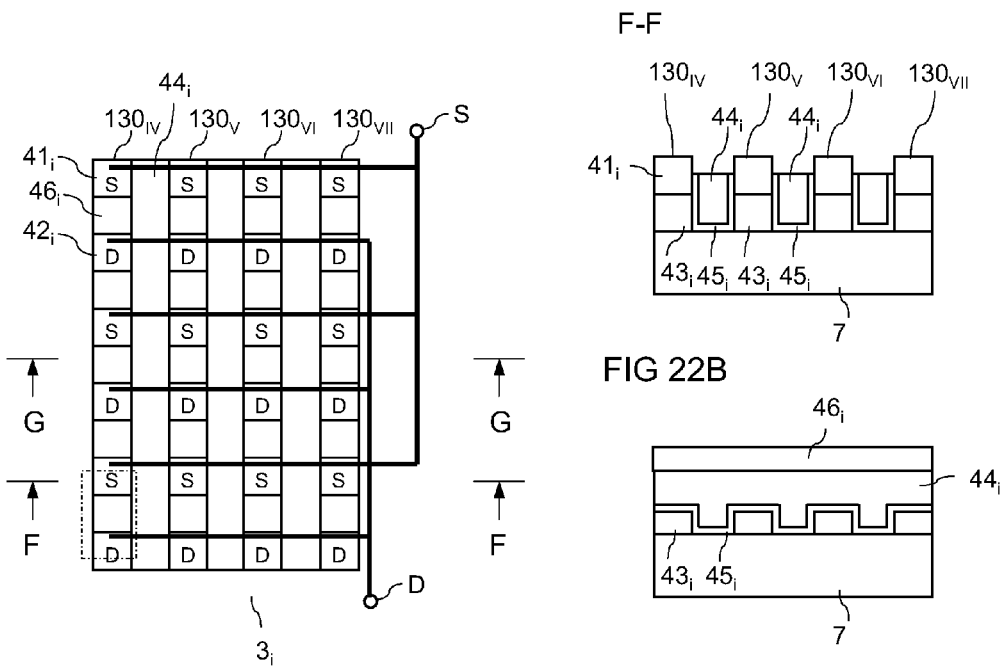
FIGS. 22A to 22C illustrates a further embodiment of one second semiconductor device including several FINFET cells connected in parallel.
Figure 22B:
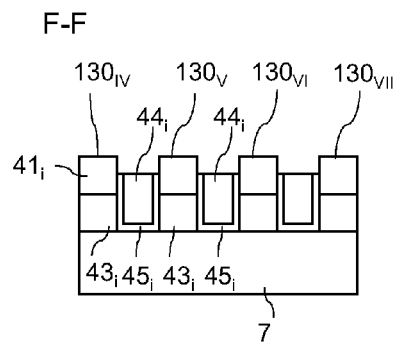
Figure 22C:
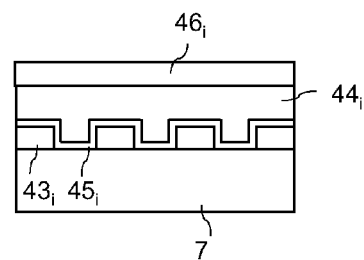

Referring to FIGS. 22A to 22C, one second transistor $3_i$ may include a plurality of semiconductor fins $130_{IV}$, $130_V$, $130_{VI}$, $130_{VII}$, with each semiconductor fin $130_{IV}$-$130_{VII}$ including a plurality of transistor cells (one of these cells is highlighted by a dashed and dotted frame in FIG. 22A). FIG. 22A shows a top view of one second transistor $3_i$, FIG. 22B shows a vertical cross sectional view in a section plane F-F cutting through source regions in different fins $130_{IV}$-$130_{VII}$, and FIG. 22C shows a vertical cross sectional view in a section plane G-G cutting through the trenches with the gate electrode 44 in different fins. Referring to FIG. 22A, the source regions $41_i$ of the individual transistor cells are connected to the first load terminal S and the drain regions of the individual transistor cells are connected to the second load terminal D of the second transistor $3_i$ so that the individual transistor cells are connected in parallel. These connections are only schematically illustrated in FIG. 22A.

The concept of providing a plurality of semiconductor fins with each semiconductor fin including a plurality of transistor cells explained with reference to FIGS. 22A to 22C is, of course, also applicable to the implementation of the first semiconductor device 6.

Although only 20 transistor cells are illustrated in FIG. 22A, namely five cells in each of the four semiconductor fins $130_{IV}$-$130_{VII}$, one second transistor $3_i$ or the first semiconductor device 6 may include up to several thousand or even up to several ten or several hundred million transistor cells connected in parallel. The individual transistor cells form a matrix of transistor cells that are connected in parallel. A device (first semiconductor device 6 or second transistor $3_i$) having a plurality of transistor cells arranged in a matrix will be referred to as matrix device in the following.

Figure 23:
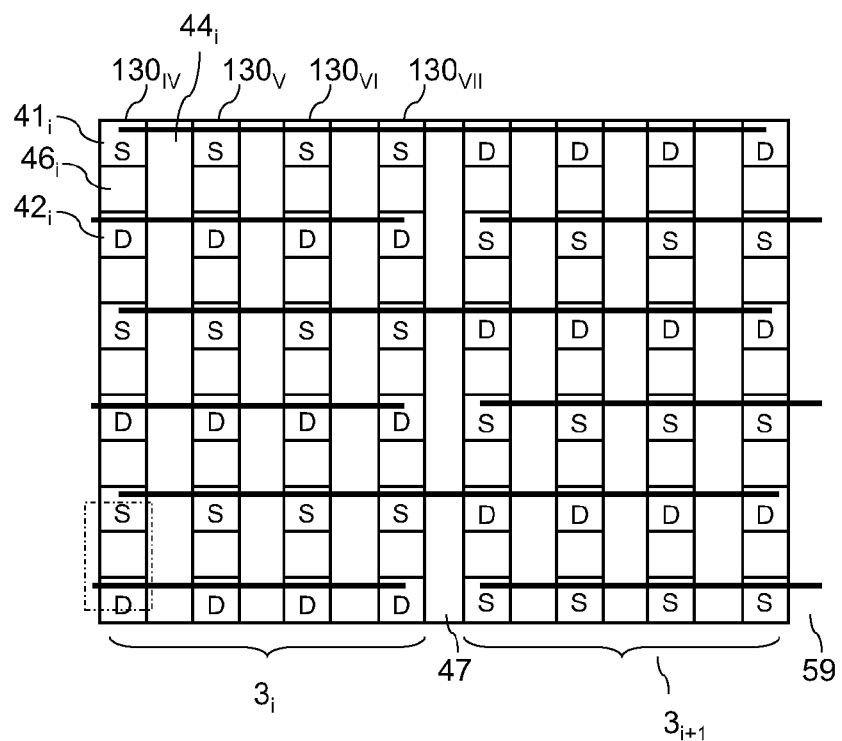
FIG. 23 illustrates two second semiconductor devices of the type illustrated in FIG. 21 connected in series.

FIG. 22 illustrates how second transistors implemented as matrix devices can be connected in series. For illustration purposes, only two second transistors $3_i$, $3_{i+1}$ are shown in FIG. 23. For connecting these two transistors in series, the source regions of the second transistor $3_i$ are connected to the drain regions of the transistor $3_{i+1}$. The drain regions of the second transistor $3_i$ are connected to the source regions of second transistors $3_{i-1}$ (not illustrated), and the source regions of the second transistor $3_{i+1}$ are connected to the drain regions of second transistors $3_{i+2}$ (not illustrated).

Referring to the explanation provided herein before, the second transistors $3_0$-$3_n$ can be implemented as depletion transistors. These depletion transistors are unipolar transistors in which in the on-state minority charge carriers flow. In an n-type depletion transistor, the majority charge carriers are electrons, while in a p-type charge carrier the majority charge carriers are holes.

However, there can be operation modes or operation scenarios of the circuit arrangement in which minority charge carriers are generated in the second transistors $3_0$-$3_n$. These minority charge carriers can be generated, for example, by thermal generation, by avalanche generation or when the circuit arrangement is operated in a reverse mode. Circuit arrangements as illustrated in FIGS. 13 to 19 are operated in the reverse mode when a voltage applied between the source terminal S of the first transistor 6 and the drain terminal $D_3$ reverse biases the first transistor 6 so that a pn-junction between the source region 61 and the body region 63 of the first transistor 6 is forward biased. In a circuit arrangement in which the first transistor 6 is implemented as an n-type enhancement transistor and in which the second transistors $3_0$-$3_n$ are implemented as n-type depletion transistors, a voltage that reverse biases the first transistor 6 is a positive voltage between the source terminal S and the drain terminal D3, while in a circuit arrangement with p-type transistors a negative voltage between the source terminal and the drain terminal reverse biases the first transistor. In this case, the first transistor 6 is operated as a diode (body diode), where the current through the first transistor 6 further flows through the second transistors $3_0$-$3_n$ to the drain terminal $D_3$. When the first transistor 6 is reverse biased, minority charge carriers from the first transistor 6 will travel through the substrate 7 to the individual second transistors $3_0$-$3_n$, when the substrate is doped complementary to the body region 63 of the first transistor 6. In an arrangement in which the substrate 7 has the same doping type as the body region 63 and is connected to the body region 63, the substrate 7 injects minority charge carriers into the body regions 43 of the second transistors $3_0$-$3_n$. However, this is dependent on the type of substrate. When, for example, an SOI substrate, as illustrated in FIG. 19, is used, a travelling of minority charge carriers from the first transistor 6 to the second transistors $3_0$-$3_n$ can be prevented.

Minority charge carriers that are generated in the second transistors $3_0$-$3_n$ or that are somehow injected into the second transistors $3_0$-$3_n$ may negatively influence the operation of the second transistors $3_0$-$3_n$. These minority charge carriers may accumulate along the gate dielectric 45 and may therefore shield the gate electrode 44, so that in a worse-case scenario the second transistors $3_0$-$3_n$ cannot be switched off any more.

In order to prevent problems that may occur in connection with the accumulation of minority charge carriers in the second transistors $3_0$-$3_n$, the second transistors $3_0$-$3_n$ may include a semiconductor region that is doped complementarily to the source, drain and body regions of the second transistors $3_0$-$3_n$ and that is connected between the body region and a source terminal or source electrode of the respective second transistor $3_0$-$3_n$.

Figures 24A, 24B:
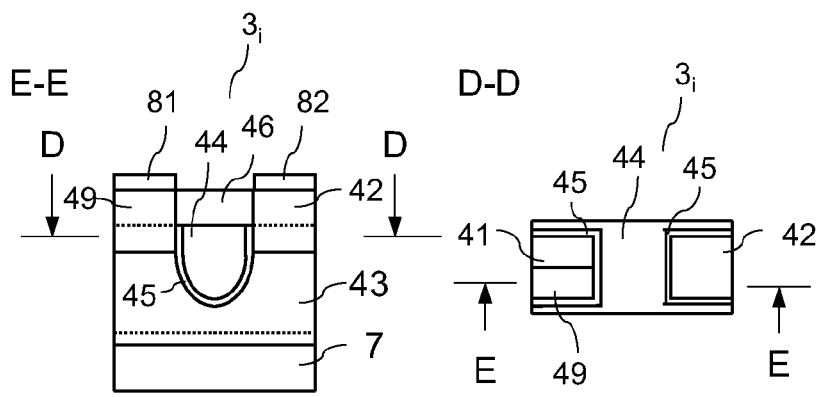
FIGS. 24A and 24B illustrates an embodiment of a second transistor that includes means that prevent the accumulation of minority charge carriers.

FIGS. 24A and 24B illustrate one embodiment of a second transistor $3_i$ that includes such an additional semiconductor region.

The second transistor $3_i$ illustrated in FIGS. 24A and 24B is implemented as an U-trench surround-gate FINFET, however, the basic principle of providing the additional semiconductor region that is doped complementarily to the active regions of the transistor $3_i$ can be applied to any type of second transistor accordingly. FIG. 24A illustrates a vertical cross sectional view of the second transistor $3_i$ in a vertical section plane extending through the semiconductor fin of the transistor $3_i$ in the longitudinal direction of the semiconductor fin. FIG. 24B illustrates a horizontal cross sectional view of the transistor $3_i$.

Referring to FIGS. 24A and 24B, the transistor $3_i$ includes a first semiconductor region 49 that is doped complementarily to the source region 41, the drain region 42 and the body region 43 of the transistor $3_i$. This first semiconductor region 49 is arranged between the body region 43 and a source electrode 81 of the transistor $3_i$, where the source electrode 81 is further connected to the source region 41. It should be noted that each of the second transistors $3_0$-$3_n$ explained before has a source electrode corresponding to the source electrode 81 illustrated in FIG. 24A. However, for the ease of illustration these source electrodes are not explicitly shown in the drawings explained before.

Referring to FIG. 24B, the first semiconductor region 49 is arranged adjacent to the source region 41, wherein both, the source region 41 and the first semiconductor region 49 are arranged between the body region 43 and the source electrode 81. The first semiconductor region 49 allows minority charge carriers that may be present in the body region 43 to flow to the source electrode 81, so as to be removed from the body region 43. The first semiconductor region 49 therefore helps to prevent an accumulation of minority charge carriers in the second transistors $3_0$-$3_n$.

Figure 25:
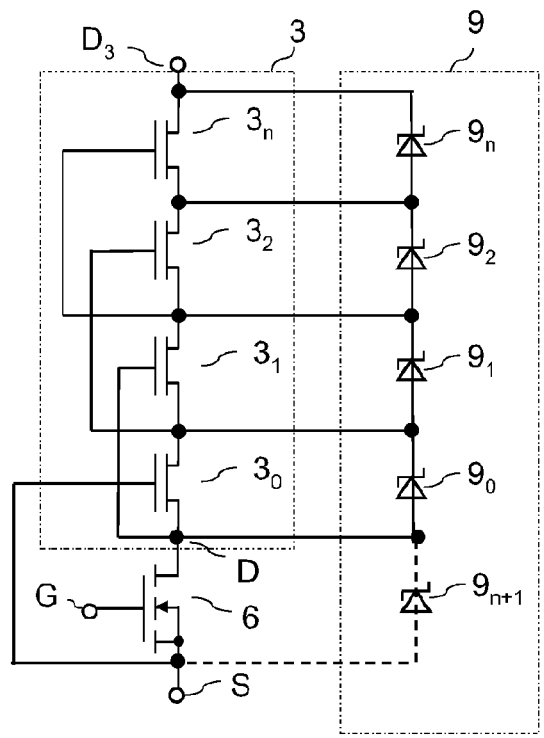
FIG. 25 illustrates a first embodiment of a circuit arrangement with a first transistor and second transistors that includes means for clamping a voltage across the second transistors.

FIG. 25 illustrates a further embodiment of a circuit arrangement including a first transistor 6 and a plurality of second transistors $3_0$-$3_n$ connected in series with the first transistor 6. The circuit arrangement illustrated in FIG. 21 is based on one of the circuit arrangements illustrated in FIGS. 13 to 23. In this embodiment, the first transistor 6 is implemented as an enhancement MOSFET, specifically as an n-type enhancement MOSFET, while the second transistors $3_0$-$3_n$ are implemented as depletion MOSFETs, specifically as n-type depletion MOSFETs, however, this is only an example. The first and second transistors $3_0$-$3_n$ could also be implemented in any of the other ways explained herein before.

When in the circuit arrangement according to FIG. 25, the first transistor 6 is switched off and when a voltage is applied between the drain terminal $D_3$ of the active drift region 3 and the source terminal S of the first transistor 6 with reverse bias condition, the voltage is distributed such that a part of this voltage drops across the load path of the first transistor 6, while other parts of this voltage drop across the load paths of the second transistors $3_0$-$3_n$. However, simulations have shown that there may be no equal distribution of this voltage to the second transistors $3_0$-$3_n$. Instead, those second transistors that are arranged closer to the first transistor 6 have a higher voltage load than those second transistors arranged distant to the first transistor 6.

In order to more equally distribute the voltage to the second transistors, the circuit arrangement of FIG. 25 includes voltage limiting means 9 that are configured to limit or clamp the voltage across the second transistors $3_0$-$3_n$. Optionally, a clamping element $9_{n+1}$ is also connected in parallel to the load path (between the source and drain terminals) of the first transistor 6. These voltage clamping means 9 can be implemented in many different ways. Just for illustration purposes the clamping means 9 illustrated in FIG. 25 include Zener diodes $9_0$-$9_{n+1}$, wherein each Zener diodes $9_0$-$9_{n+1}$ is connected in parallel with the load path of one of the second transistors $3_0$-$3_n$ and, optionally, the first transistor 6.

Figure 26:
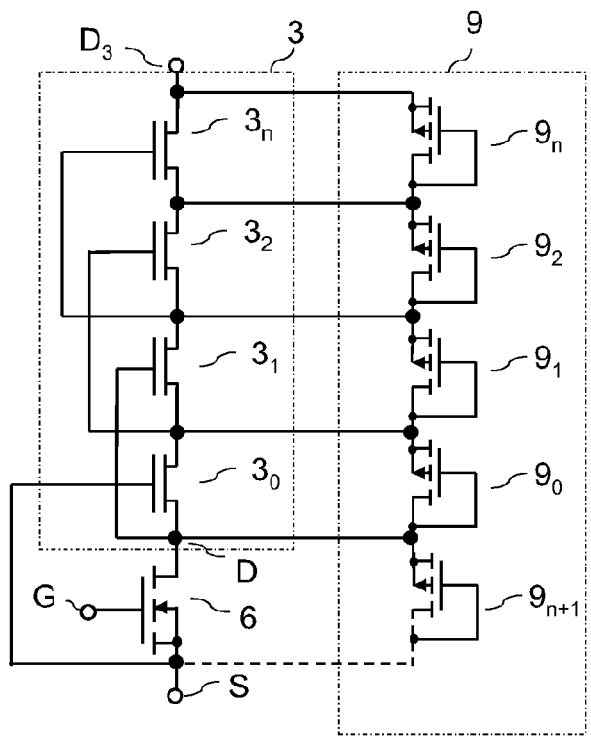
FIG. 26 illustrates a second embodiment of a circuit arrangement with a first transistor and second transistors that includes means for clamping a voltage across the second transistors.

Instead of Zener diodes, tunnel diodes, PIN diodes, avalanche diodes, or the like, may be used as well. According to a further embodiment that is illustrated in FIG. 26, the individual clamping elements $9_0$-$9_{n+1}$ are implemented as transistors, such as, for example, p-type MOSFET. Each of these MOSFET has its gate terminal connected to its drain terminal, and the load path (the drain-source path) of each MOSFET is connected in parallel with the load path of one second transistor $3_0$-$3_n$.

The individual clamping elements, such as the Zener diodes $9_0$-$9_n$ illustrated in FIG. 25 or the MOSFETs $9_0$-$9_n$ illustrated in FIG. 26 can be integrated in the same semiconductor body as the second transistors $3_0$-$3_n$. However, these clamping elements could also be implemented as external devices arranged outside the semiconductor body.

Connecting clamping elements parallel to the second transistors $3_0$-$3_{n+1}$ is not limited to circuit arrangements in which the second transistors are connected in series with the first transistor 6. Clamping elements can also be connected in parallel with the second transistors $3_0$-$3_n$ in a circuit arrangement as illustrated in FIG. 1 in which the second transistors $3_0$-$3_n$ are connected in parallel to (sections of) the drift region 2 of a first transistor 1.

Although in the embodiment illustrated in FIG. 25, each second transistor $3_0$-$3_n$ has one clamping element associated thereto, there may be first and second transistors that do not have a clamping element associated thereto. According to one embodiment, only transistors that are arranged close to the first transistor 6 in the transistor chain with the first transistor 6 and the second transistor $3_0$-$3_n$ have a clamping element associated thereto, while transistors that are arranged more distant to the first transistor 6 do not have a clamping element associated thereto. Further, one clamping element could be associated with two or more second transistors connected in series. In this case, one clamping element is connected in parallel with a series circuit of two or more second transistors $3_0$-$3_n$.

Alternatively or additionally to providing clamping elements, such as Zener diodes, measures for limiting or clamping the voltage drop across one second transistor can be integrated in the first and second transistors itself.

Figures 27A, 27B:
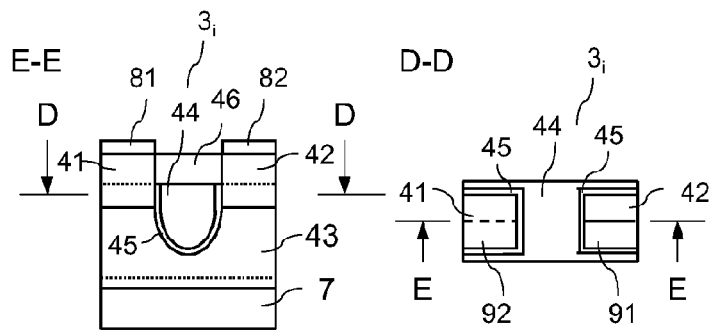
FIGS. 27A and 27B illustrates a first embodiment of a second transistor that includes integrated voltage across the second transistors.

FIGS. 27A and 27B illustrate an embodiment of one second transistor $3_i$. This transistor is implemented as U-trench surround-gate FINFET, where FIG. 27A shows a vertical cross sectional view of the transistor $3_i$ and FIG. 27B illustrates a horizontal cross sectional view of the transistor $3_i$. This transistor has a source region 41 and a drain region 42, wherein the source region 41 is electrically connected to a source electrode 81 and the drain region 42 is electrically connected to a drain electrode 82. This transistor $3_i$ further includes at least one semiconductor region 91 that is doped complementarily to the drain region 42, adjoins the body region 43 and is connected to the drain electrode 82. Optionally, a second semiconductor region 92 that is doped complementarily to the source region 41 adjoins the body region 43 and is connected to the source electrode 81. The first and second semiconductor regions 91, 92 adjoin the gate dielectric 45 in regions where it is covered by a gate electrode 44. The first and second semiconductor regions 91, 92 together with the body region 43 form an enhancement MOSFET of a conduction type complementary to the conduction type of the second transistor $3_i$. The enhancement MOSFET is switched on, when a voltage between the voltage at the gate electrode 44 and the source region 41 reaches the threshold voltage of this MOSFET, so that the voltage drop across the transistor $3_i$ is clamped to a value close to the threshold voltage of this enhancement transistor that is complementary to the second transistor $3_i$.

Figure 28:
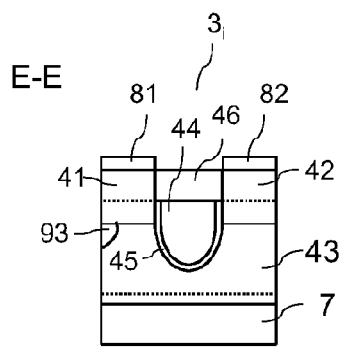
FIG. 28 illustrates a second embodiment of a second transistor that includes integrated voltage clamping means.

FIG. 28 illustrates a further embodiment of a second transistor $3_i$ that includes integrated clamping means. FIG. 28 shows a vertical cross sectional view of this transistor $3_i$. This transistor $3_i$ includes an avalanche region 93 of the same doping type as the source region 41, arranged in the body region 43 and adjoining the source region 41. The doping concentration of this avalanche region 93 is higher than the doping concentration of the body region 43, and may correspond to the doping concentration of the source region 41. Starting from this avalanche region 93, an avalanche breakthrough sets in in order to clamp the voltage across the transistor $3_i$, when the voltage between the source and drain regions 41, 42 reaches an avalanche voltage that is defined by the avalanche region 93.

Figure 29:
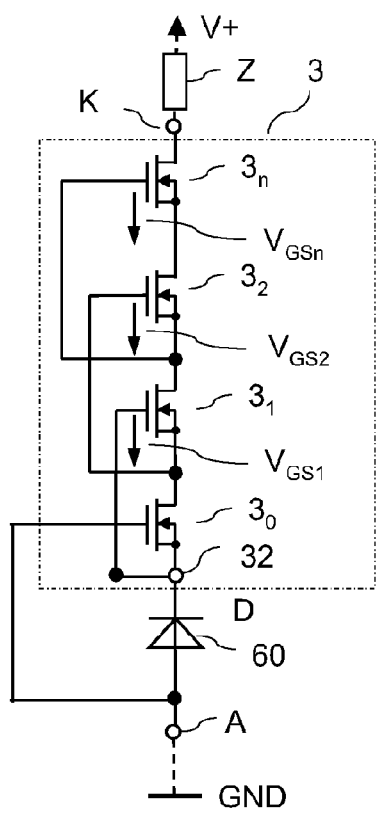
FIG. 29 illustrates an embodiment of a circuit arrangement with a diode and with second transistors connected in series with the diode.

In the embodiments explained before, the circuit arrangement with the first transistor 1, 6 and the second transistor is controlled by controlling the first transistor 1, 6, which means by switching on or off the second transistor 1, 6. Instead of a transistor for controlling the state of the circuit arrangement, a diode could be used as well. FIG. 29 illustrates a circuit arrangement that is based on the circuit arrangement of FIG. 13 and that includes a diode 60 instead of a transistor. In the embodiment illustrated in FIG. 29, this diode 60 is connected such that the circuit arrangement blocks (is switched off), when the diode 60 is reverse biased, which is when a positive voltage is applied between the drain terminal $D_3$ of the active drift zone, and an anode terminal of the diode 60. This diode can be implemented as an enhancement MOSFET with a floating gate terminal or with a gate terminal connected to a fixed reference potential, such as ground. In this case, the diode is formed by the body diode of the enhancement MOSFET. Everything that has been explained concerning the implementation of the active drift region with the second transistors $3_0$-$3_n$ herein before applies to the implementation of the active drift region 3 of FIG. 29 accordingly.

A circuit arrangement as explained before with a first transistor 1 and a series circuit with second transistors $3_0$-$3_n$ connected in parallel to the drift region of the first transistor or a circuit arrangement with a first transistor 6 and a series circuit with second transistors $3_0$-$3_n$ connected in series with the load path of the first transistor 6 can be used like a conventional transistor, in particular like a conventional MOSFET.

Figure 30:
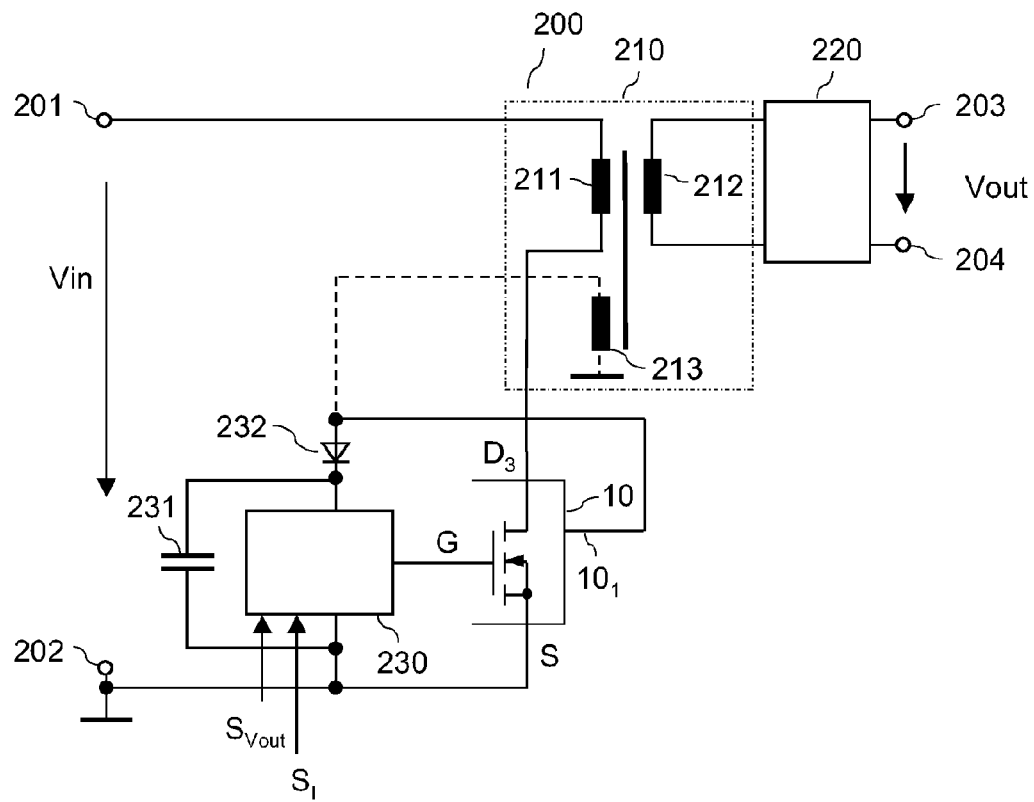
FIG. 30 illustrates the application of a circuit arrangement with a first transistor and with a plurality of second transistors in a voltage converter.

FIG. 30 illustrates one possible application of such circuit arrangement. Reference character 10 in FIG. 30 denotes one of the circuit arrangements with a first transistor 1 or 6 respectively, and a series circuit with second transistors $3_0$-$3_n$ as explained before. This transistor 10 with the active drift region (ADR) or active drift zone (ADZ) will be referred to as ADR transistor 10 in the following. The ADR transistor 10 has a gate terminal G, formed by the gate terminal of the first transistor, a source terminal S formed by the source terminal of the first transistor and a drain terminal $D_3$ that is either formed by the drain terminal of the first transistor and/or by a drain terminal of the second transistor $3_n$ arranged most distant to the first transistor in the series circuit with the second transistors $3_0$-$3_n$.

FIG. 30 illustrates the use of the ADR transistor 10 in a voltage converter, in particular in a switched-mode voltage converter having a flyback-converter topology. This voltage converter includes input terminals 201, 202 for applying an input voltage Vin and output terminals 203, 204 for providing an output voltage Vout. The voltage converter serves to convert the input voltage Vin into the output voltage Vout. The converter includes a transformer 210 with a primary winding 211 and a secondary winding 212. The ADR transistor 10 is connected in series with the primary winding 211, where the series circuit with the primary winding 211 and the ADZ transistor 10 is connected between the input terminals 211, 212. A control circuit 230 is connected to the gate terminal of the ADR transistor 10 and is configured to provide a pulse-width modulated (PWM) drive signal S230 to the gate terminal G of the ADR transistor 10 that cyclically switches the ADR transistor 10 on and off, when the voltage converter is in operation. When the ADR transistor 10 is cyclically switched on and off, a PWM square voltage is generated at the secondary winding 212 of the transformer 210, where this PWM square voltage is rectified by a rectifier arrangement 220 connected between the secondary winding 212 and the output terminals 203, 204. The rectifier arrangement 220 may, for example, include at least one rectifier element, such as a diode, and a capacitor.

The output voltage Vout can be controlled by controlling the duty cycle of the PWM drive signal S230 provided by the control circuit 230. For this, the control circuit 230 may receive an output voltage signal $S_{Vout}$ that is representative of the output voltage Vout. Generating and transmitting this output voltage $S_{Vout}$ to the control circuit 230 is commonly known, so that no further explanations are required in this regard. Further, the control circuit 230 may receive a current signal $S_I$ that represents a load current through the ADR transistor 10. Generating such a current signal $S_I$ is also known, so that no further explanations are required in this regard. Based on the output voltage signal $S_{Vout}$ and the current signal $S_I$, the control circuit 230 generates the PWM drive signal S230. A PWM control circuit that generates a PWM drive signal from an output voltage signal and a current signal is commonly known, so that no further explanations are required in this regard.

The control circuit 230 includes power supply terminals, wherein a supply capacitance 231 is connected between these power supply terminals. To enable the control circuit 230 to generate the PWM drive signal S230 a supply voltage is required between the power supply terminals, which means that the power supply capacitor 231 has to be charged before the ADR transistor 10 can be switched on for the first time. In operation of the voltage converter, which is when the ADR transistor 10 is cyclically switched on an off, the power supply capacitor 231 can be charged by an auxiliary winding 213 of the transformer 210, where this auxiliary winding 213 is inductively coupled to the primary winding 211 and the secondary winding 212 and is connected to the power supply capacitor 231 via a rectifier element 232, such as a diode.

At the time start-up of the voltage-converter, which is when the input voltage Vin is applied between the input terminals 201, 202 for the first time, the ADR transistor 10 is switched off. The input voltage Vin therefore mainly drops between the drain terminal $D_3$ and the source terminal S of the ADR transistor 10. Referring to FIG. 26, the ADR transistor 10 has an output terminal $10_1$ that is connected to the supply capacitor 231 via the rectifier element 232. This output terminal $10_1$ is connected to a tap of the series circuit of the second transistors and provides an output voltage that is lower than the input voltage Vin and that is suitable to charge the supply capacitor 231.

Figure 31:
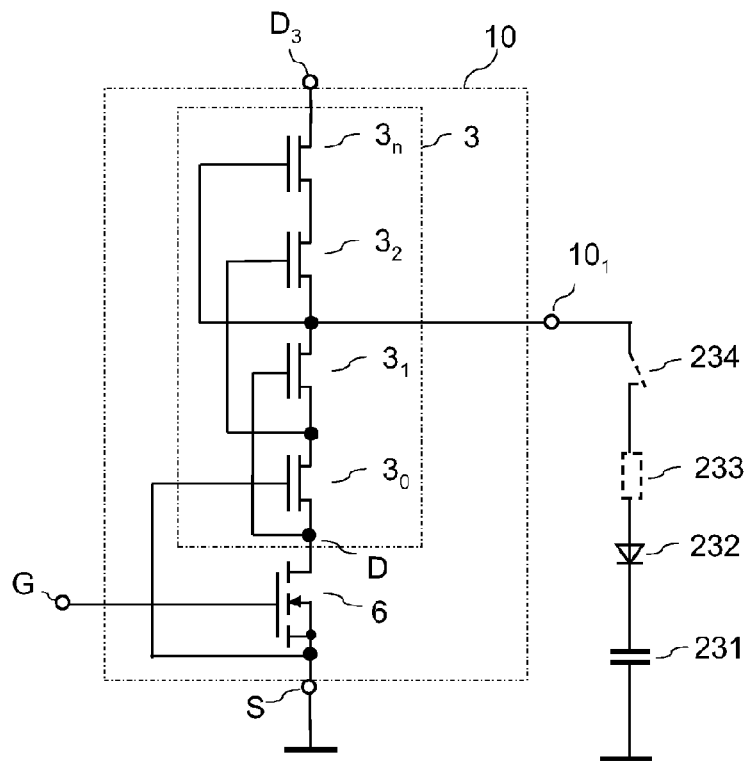
FIG. 31 illustrates a first embodiment of the circuit arrangement and a power supply circuit of the voltage converter in detail.

FIG. 31 illustrates an embodiment of the ADR transistor 10 in detail. For a better understanding, the rectifier elements 232 and the supply capacitor 231 are also illustrated in FIG. 27. Referring to FIG. 31, the output terminal $10_1$ is connected to a tap between two of the second transistors, wherein in the embodiment according to FIG. 30, the output terminal $10_1$ is connected to a tap between the second transistors $3_1$ and $3_2$. When the ADR transistor 10 is in the off-state, it acts like a voltage divider, so that the voltage at the output terminal $10_1$ is lower than the overall voltage between the drain terminal $D_3$ and the source terminal S. The desired output voltage at the output terminal $10_1$ can be adjusted by suitably selecting the tap, where the output voltage is lower at taps arranged closer to the first transistor 6 than at taps arranged more distant to the first transistor 6.

Referring to FIG. 31, optionally a resistor 233 is connected between the output terminal $10_1$ and the supply capacitor 231. This resistor may help to limit a charging current to the supply capacitor 231. Further, a switch 234 can be connected between the output terminal $10_1$ and the capacitor 231. Through this switch 234 the charging mechanism that charges the supply capacitor 231 via the output terminal $10_1$ can be deactivated when the voltage converter is in operation, which is when the auxiliary winding 213 provides the charging current to the capacitor 231.

Figure 32:
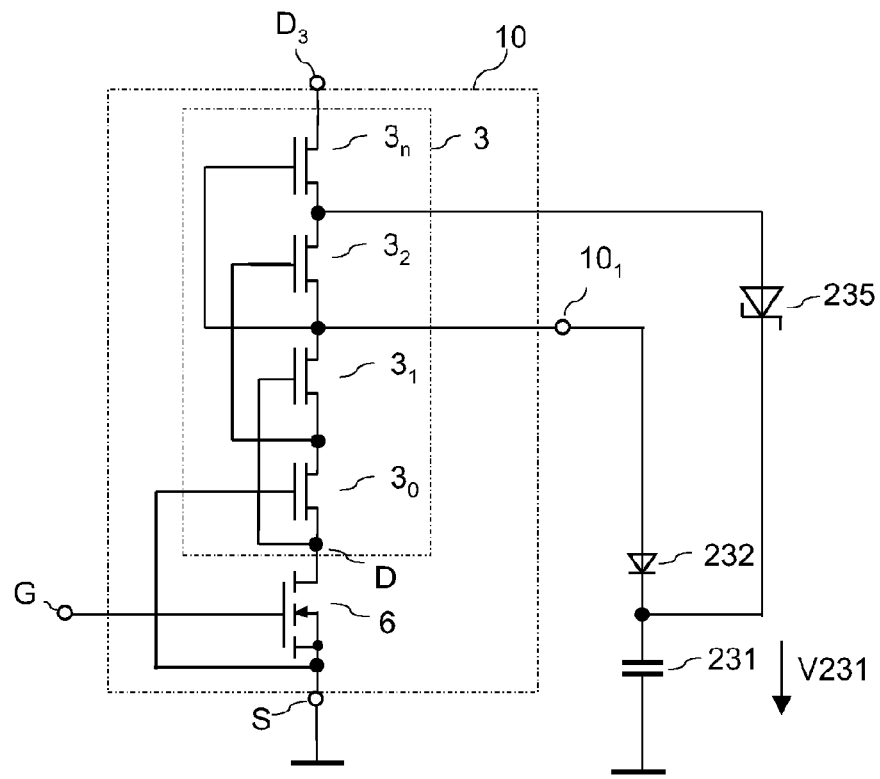
FIG. 32 illustrates a second embodiment of the circuit arrangement and a power supply circuit of the voltage converter in detail.
Figure 33:
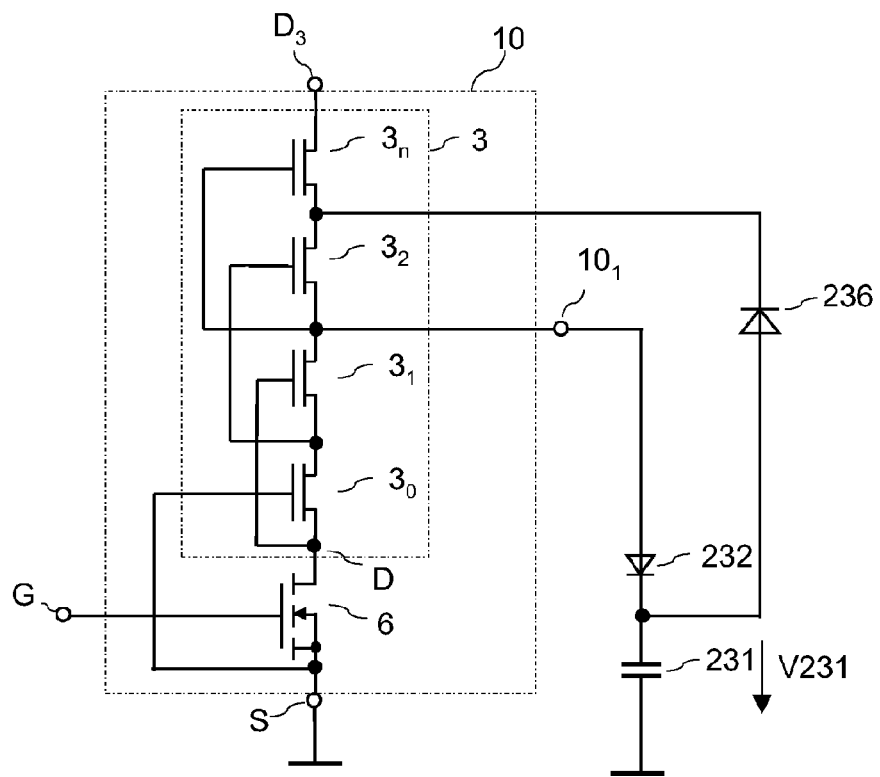
FIG. 33 illustrates a first embodiment of the circuit arrangement and a power supply circuit of the voltage converter in detail.

FIGS. 32 and 33 illustrate two additional embodiments of charging circuits using the ADR transistor 10 for charging a capacitor 231, such as a supply capacitor. In the embodiment illustrated in FIG. 32, the rectifier element 232 is connected to a first tap of the ADR transistor 10 and a voltage limiting element 235, such as a Zener or Avalanche diode or a series circuit of Zener or Avalanche diodes, is connected to a second tap of the ADR transistor 10. The first tap is arranged closer to the first transistor 6 than the second tap in the series circuit of the second transistors $3_0$-$3_n$. The voltage limiting element 235 is connected between the capacitor 231 and the second tap. In this circuit the capacitor 231 is discharged via the voltage limiting element whenever the voltage across the capacitor 231 is higher than the electrical potential at the second tap plus the limiting voltage of the voltage limiting element. The operating principle of the circuit according to FIG. 32 is as follows: When the ADR transistor is switched off so that the electrical potentials at the individual taps increase, the capacitor is charged to the electrical potential of the first tap minus the forward voltage of the diode 232. When the voltage across the series circuit with the second transistors $3_0$-$3_n$ further increases so that the electrical potential at the second tap becomes higher than at the first tap, the capacitor is further charged, namely to the electrical potential at the second tap minus the forward voltage of the Zener diode 235. In each case, the capacitor 231 is only discharged when the first transistor 6 is switched on and when the electrical potential at the second tap decreases to the voltage V231 of the capacitor minus the breakthrough voltage of the Zener diode 235. Thus, the voltage V231 of the capacitor is in accordance with a hysteresis curve.

In the embodiment illustrated in FIG. 33, a further rectifier element 236, such as a diode is connected between the capacitor 231 and the second tap. In this circuit a voltage V231 having a hysteresis is generated across the capacitor when the ADR transistor is switched off and on. When the ADR transistor 10 is switched off and the electrical potential at the first tap increases, the capacitor 231 is charged to an electrical potential approximately corresponding to the electrical potential at the tap (the forward voltage of the diode 232 is usually negligible relative to the voltage at the first tap). When the ADR transistor is switched on so that the electrical potential at the second tap decreases, the voltage V231 approximately corresponds to the electrical potential at the second tap (the forward voltage of the further diode 236 is usually negligible relative to the voltage at the second tap), where the electrical potential at the second tap approximately corresponds to source potential when the ADR transistor is completely switched on.

Instead of using the output terminal $10_1$ for charging a supply capacitor 231, the output terminal $10_1$ could also be used for simply measuring the voltage drop within the ADR transistor 10.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A semiconductor device arrangement, comprising:
a first transistor having a load path between load terminals and a control terminal configured to receive a drive voltage that switches on or switches off the first transistor;
a plurality of second transistors, each second transistor having a load path between a first load terminal and a second load terminal and a control terminal;
wherein the second transistors have their load paths connected in series and connected in series to the load path of the first transistor;
wherein each but one of the second transistors has its control terminal connected to the load terminal of another one of the second transistors;
wherein one of the second transistors has its control terminal connected to one of the load terminals of the first transistor; and
wherein the first transistor comprises a normally-off transistor.

2. The semiconductor device arrangement of claim 1, wherein one of the second transistors that has its load path directly connected to the load path of the first transistor and has its control terminal connected to a first load terminal of the first transistor and wherein each of the other second transistors has its control terminal connected to a first load terminal of an adjacent second transistor.

3. The transistor arrangement of claim 1, wherein the first transistor and/or one or more of the second transistors is one of a MOSFET, a MISFET, a MESFET, an IGBT, a JFET, a HEMT, a FINFET, or a nanotube device.

4. The semiconductor device arrangement of claim 1, wherein the first transistor and/or the second transistors comprise one of the following materials or compositions thereof: Si, SiO, SiN, Ge, Ga, Al, GaAs, GaN, carbon, In, InP, SiC.

5. The semiconductor device of claim 1, wherein the second transistors are normally-on transistors.

6. The semiconductor device arrangement of claim 1, wherein the first transistor is one of an n-channel or p-channel transistor.

7. The semiconductor device arrangement of claim 1, wherein the second transistors are one of n-channel or p-channel transistors.

8. The semiconductor device arrangement of claim 1, wherein the first transistor and the second transistors are implemented in a common semiconductor body.

9. The semiconductor device arrangement of claim 1, wherein the second transistors are implemented as FINFETs, each second transistor comprising:
a semiconductor fin;
a source region, a body region and a drain region arranged in the semiconductor fin, the body region being arranged between the source region and the drain region; and
a gate electrode arranged adjacent to the body region and dielectrically insulated from the body region by a gate dielectric.

10. The semiconductor device arrangement of claim 9, wherein the source and drain regions are arranged distant in a longitudinal direction of the semiconductor fin.

11. The semiconductor device arrangement of claim 9, wherein the semiconductor fin includes sidewalls and wherein the gate electrode is arranged at least on one of the sidewalls of the semiconductor fin.

12. The semiconductor device arrangement of claim 9, wherein the semiconductor fin is arranged above a substrate.

13. The semiconductor device arrangement of claim 12, wherein the substrate includes at least one semiconductor layer adjoining the body regions of the second transistors.

14. The semiconductor device arrangement of claim 12, wherein the substrate includes a dielectric layer adjoining the body regions of the second transistors.

15. The semiconductor device arrangement of claim 9, wherein the semiconductor fins of two neighboring second transistors are separated by an insulation layer.

16. The semiconductor device arrangement of claim 9, wherein one FINFET further comprises:
a source electrode connected to the source region; and
a semiconductor region doped complementarily to the source region and connected to the source electrode.

17. The semiconductor arrangement of claim 9, wherein the first transistor is implemented as a FINFET comprising:
at least one semiconductor fin;
a source region, a body region and a drain region arranged in the at least one semiconductor fin, the body region being arranged between the source region and the drain region; and
a gate electrode arranged adjacent to the body region and dielectrically insulated from the body region by a gate dielectric.

18. The semiconductor device arrangement of claim 1, further comprising at least one voltage limiting element connected in parallel with at least one second transistor and/or in parallel to the first transistor.

19. A method for operating a semiconductor device arrangement,
wherein the semiconductor device arrangement comprises:
a first transistor having a load path between load terminals and a control terminal configured to receive a drive voltage that switches on or switches off the first transistor;
a plurality of second transistors, each having a load path between a first load terminal and a second load terminal and a control terminal;
wherein the second transistors have their load paths connected in series and connected in series to the load path of the first transistor;
wherein each but one of the second transistors has its control terminal connected to the load terminal of another one of the second transistors;
wherein one of the second transistors has its control terminal connected to one of the load terminals of the first transistor; and
wherein the method comprises switching the semiconductor device arrangement on or switching the semiconductor device arrangement off by applying a drive potential to the control terminal of the first transistor.

20. The method of claim 19, wherein the first transistor comprises a normally-off transistor.

21. A circuit arrangement comprising:
a transistor arrangement with a first transistor having a load path and a control terminal and with a plurality of second transistors, each second transistor having a load path between a first and a second load terminal and a control terminal, wherein the second transistors have their load paths connected in series and connected in series to the load path of the first transistor, and wherein each but one of the second transistors has its control terminal connected to the load terminal of another one of the second transistors, and wherein one of the second transistors has its control terminal connected to one of the load terminals of the first transistor; and a capacitive storage element connected to the load terminal of one of the second transistors.

22. The circuit arrangement of claim 21, further comprising a control circuit having an output terminal coupled to the control terminal of the first transistor and having supply terminals, wherein the capacitive storage element is connected to the supply terminals of the control circuit.

23. The circuit arrangement of claim 22, wherein the control circuit is configured to provide a pulse-width modulated drive signal to the first transistor.

24. The circuit arrangement of claim 21, further comprising a load connected in series with the transistor arrangement, the series circuit with the transistor arrangement and the load being connected between input terminals that are configured to have an input voltage applied thereto.

25. The circuit arrangement of claim 24, wherein the load comprises:
- a transformer with a first winding connected in series with the transistor arrangement and with a second winding inductively coupled with the first winding; and
- a rectifier arrangement coupled to the second winding and comprising output terminals configured to provide an output voltage.

* * * * *